United States Patent
Mann et al.

(10) Patent No.: US 7,869,138 B2
(45) Date of Patent: Jan. 11, 2011

(54) PROJECTION OBJECTIVE AND PROJECTION EXPOSURE APPARATUS WITH NEGATIVE BACK FOCUS OF THE ENTRY PUPIL

(75) Inventors: Hans-Juergen Mann, Oberkochen (DE); Wolfgang Singer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 908 days.

(21) Appl. No.: 11/689,672

(22) Filed: Mar. 22, 2007

(65) Prior Publication Data
US 2007/0223112 A1 Sep. 27, 2007

Related U.S. Application Data

(60) Provisional application No. 60/786,744, filed on Mar. 27, 2006.

(30) Foreign Application Priority Data
Mar. 27, 2006 (DE) ........................ 10 2006 014 380

(51) Int. Cl.
*G02B 17/00* (2006.01)
(52) U.S. Cl. ....................................................... 359/726
(58) Field of Classification Search .......... 359/726–736
See application file for complete search history.

(56) References Cited

U.S. PATENT DOCUMENTS

| | | | |
|---|---|---|---|
| 4,655,555 A | 4/1987 | Maechler et al. | |
| 5,003,567 A | 3/1991 | Hawryluk et al. | |
| 5,212,588 A | 5/1993 | Viswanathan et al. | |
| 5,686,728 A | 11/1997 | Shafer | |
| 5,812,309 A | 9/1998 | Thoma et al. | |
| 5,815,310 A | 9/1998 | Williamson | |
| 6,033,079 A | 3/2000 | Hudyma | |
| 6,195,201 B1 | 2/2001 | Koch et al. | |

(Continued)

FOREIGN PATENT DOCUMENTS

DE           33 43 868           6/1985

(Continued)

OTHER PUBLICATIONS

Russell Hudyma, "An Overview of Optical Systems for 30nm Resolution Lithography at EUV Wavelengths," Proceedings of SPIE, vol. 4832, Dec. 2002, pp. 137-148.

(Continued)

*Primary Examiner*—Darryl J Collins
(74) *Attorney, Agent, or Firm*—Fish & Richardson P.C.

(57) ABSTRACT

The disclosure concerns a projection objective, which can include an object plane in which an object field is formed, an entry pupil, a mirrored entry pupil (RE) in a mirrored entry pupil plane obtained by mirroring the entry pupil (VE) at the object plane, an image plane, an optical axis, at least a first mirror and a second mirror. The projection objective can have a negative back focus of the entry pupil, and a principal ray originating from a central point of the object field and traversing the objective from the object plane to the image plane can intersect the optical axis in at least one point of intersection, wherein the geometric locations of all points of intersection lie between the image plane and the mirrored entry pupil plane.

45 Claims, 24 Drawing Sheets

U.S. PATENT DOCUMENTS

| | | |
|---|---|---|
| 6,198,793 B1 | 3/2001 | Schultz et al. |
| 6,240,158 B1 | 5/2001 | Oshino |
| 6,244,717 B1 | 6/2001 | Dinger |
| 6,359,678 B1 | 3/2002 | Ota |
| 6,452,661 B1 | 9/2002 | Komatsuda |
| 6,512,641 B2 | 1/2003 | Omura |
| 6,549,270 B1 | 4/2003 | Ota |
| 6,666,560 B2 | 12/2003 | Suzuki |
| 6,710,917 B2 | 3/2004 | Mann et al. |
| 6,750,948 B2 | 6/2004 | Omura |
| 6,867,913 B2 | 3/2005 | Mann et al. |
| 6,894,834 B2 | 5/2005 | Mann et al. |
| 2001/0038446 A1 | 11/2001 | Takahashi |
| 2002/0171048 A1 | 11/2002 | Braat |
| 2004/0114217 A1 | 6/2004 | Mann et al. |
| 2004/0165282 A1 | 8/2004 | Sunaga et al. |
| 2004/0252358 A1 | 12/2004 | Kawahara et al. |
| 2005/0088760 A1 | 4/2005 | Mann et al. |
| 2006/0232867 A1 | 10/2006 | Mann et al. |

FOREIGN PATENT DOCUMENTS

| | | |
|---|---|---|
| DE | 10 2005 042 005 | 7/2006 |
| EP | 1 069 448 | 1/2001 |
| EP | 1 093 021 | 4/2001 |
| EP | 1 199 590 | 4/2002 |
| EP | 1 225 481 | 7/2002 |
| EP | 1 434 093 | 6/2004 |
| EP | 1 450 196 | 8/2004 |
| JP | 3-041328 | 2/1991 |
| JP | 11-110791 | 4/1999 |
| JP | 2003-114387 | 4/2003 |
| TW | 476943 | 2/2002 |
| TW | 226938 | 1/2005 |
| WO | WO 2004/010224 | 1/2004 |

OTHER PUBLICATIONS

Bal, Matthieu Frédéric, dissertation "Next-Generation Extreme Ultraviolet Lithographic Projection Systems", pp. 1-139, (Feb. 10, 2003).

Table 1

| Surface | Radius | Thickness | Mode |
|---|---|---|---|
| Object | INFINITY | 340.063 | |
| Mirror 1 | 541.604 | -240.063 | REFL |
| Mirror 2 | 767.655 | 1359.666 | REFL |
| Mirror 3 | -403.377 | -100.907 | REFL |
| Mirror 4 | -245.920 | 101.241 | REFL |
| STOP | INFINITY | 0.000 | |
| Mirror 5 | 245.625 | -78.546 | REFL |
| Mirror 6 | 161.871 | 118.546 | REFL |
| Image | INFINITY | 0.000 | |

| Surface | K | A | B |
|---|---|---|---|
| Mirror 1 | 0.00000E+00 | -2.76457E-09 | -1.26272E-14 |
| Mirror 2 | 0.00000E+00 | -2.03348E-10 | -2.46751E-16 |
| Mirror 3 | 0.00000E+00 | 1.85641E-09 | 1.36854E-15 |
| Mirror 4 | 0.00000E+00 | 1.17196E-08 | -4.61185E-13 |
| Mirror 5 | 0.00000E+00 | 5.07237E-08 | 3.41540E-12 |
| Mirror 6 | 0.00000E+00 | 1.06445E-08 | 5.39891E-13 |

| Surface | C | D | E |
|---|---|---|---|
| Mirror 1 | 3.37883E-19 | -4.45867E-24 | 2.16762E-29 |
| Mirror 2 | -1.92698E-21 | 7.69579E-27 | -2.58196E-32 |
| Mirror 3 | 4.80738E-20 | -2.38457E-25 | 2.95652E-30 |
| Mirror 4 | 2.24623E-17 | -1.63691E-21 | 6.17234E-26 |
| Mirror 5 | 8.26510E-17 | 4.41847E-19 | -3.25606E-22 |
| Mirror 6 | 2.40272E-17 | 1.09027E-21 | 8.43531E-26 |

Wherein:
"Surface"  
"Object" means the object plane  
Mirror 1 means the mirror S1  
Mirror 2 means the mirror S2  
Mirror 3 means the mirror S3  
Mirror 4 means the mirror S4  
"STOP" means the aperture stop  
Mirror 5 means the mirror S5  
Mirror 6 means the mirror S6

"image" means the image plane  
"radius"  
"thickness"  
"mode" characteristic of the optical surface  
"REFL" a reflective surface  
"INFINITY"  
K conical constant  
A,B,C,D,E aspherical constants

FIG. 2B

Table 2

| Surface | Radius | Thickness | Mode |
|---|---|---|---|
| Object | INFINITY | 379.241 | |
| Mirror 1 | 468.674 | -279.241 | REFL |
| Mirror 2 | 791.140 | 1460.000 | REFL |
| Mirror 3 | -464.221 | -108.146 | REFL |
| Mirror 4 | -293.724 | 108.146 | REFL |
| STOP | INFINITY | 0.000 | |
| Mirror 5 | 254.762 | -79.487 | REFL |
| Mirror 6 | 165.876 | 119.487 | REFL |
| Image | INFINITY | 0.000 | |

| Surface | K | A | B | C |
|---|---|---|---|---|
| Mirror 1 | 0.00000E+00 | -1.97745E-09 | -3.31838E-14 | 5.52752E-19 |
| Mirror 2 | 0.00000E+00 | -1.35785E-10 | -5.45339E-17 | -1.64232E-21 |
| Mirror 3 | 0.00000E+00 | 1.46199E-09 | -1.81989E-15 | 5.15326E-20 |
| Mirror 4 | 0.00000E+00 | 6.99543E-09 | -4.00395E-13 | 2.32169E-17 |
| Mirror 5 | 0.00000E+00 | 4.48045E-08 | 2.84169E-12 | 4.77738E-16 |
| Mirror 6 | 0.00000E+00 | 1.01439E-08 | 4.93440E-13 | 2.28735E-17 |

| Surface | D | E | F | G |
|---|---|---|---|---|
| Mirror 1 | -5.50393E-24 | 2.53787E-29 | -4.98907E-35 | 8.46612E-41 |
| Mirror 2 | 6.78729E-27 | -2.22312E-32 | 3.92966E-38 | -4.04401E-44 |
| Mirror 3 | -5.50659E-28 | 5.30227E-30 | -2.43653E.35 | 5.01854E-41 |
| Mirror 4 | -2.02966E-21 | 1.15713E-25 | -3.85058E-30 | 5.67798E-35 |
| Mirror 5 | -5.39737E-19 | 5.10878E-22 | -1.46306E-32 | -1.75867E-28 |
| Mirror 6 | 4.95032E-23 | 2.81966E-25 | -2.82893E-29 | 1.63424E-33 | wobei:

Wherein:
"Surface"                               "image"           means the image plane
"Object"         means the object plane  "radius"
Mirror 1         means the mirror S1     "thickness"
Mirror 2         means the mirror S2     "mode"            characteristic of the
Mirror 3         means the mirror S3                       optical surface
Mirror 4         means the mirror S4     "REFL"            a reflective surface
"STOP"           means the aperture stop "INFINITY"
Mirror 5         means the mirror S5     K                 conical constant
Mirror 6         means the mirror S6     A,B,C,D,E         aspherical constants

FIG. 3B

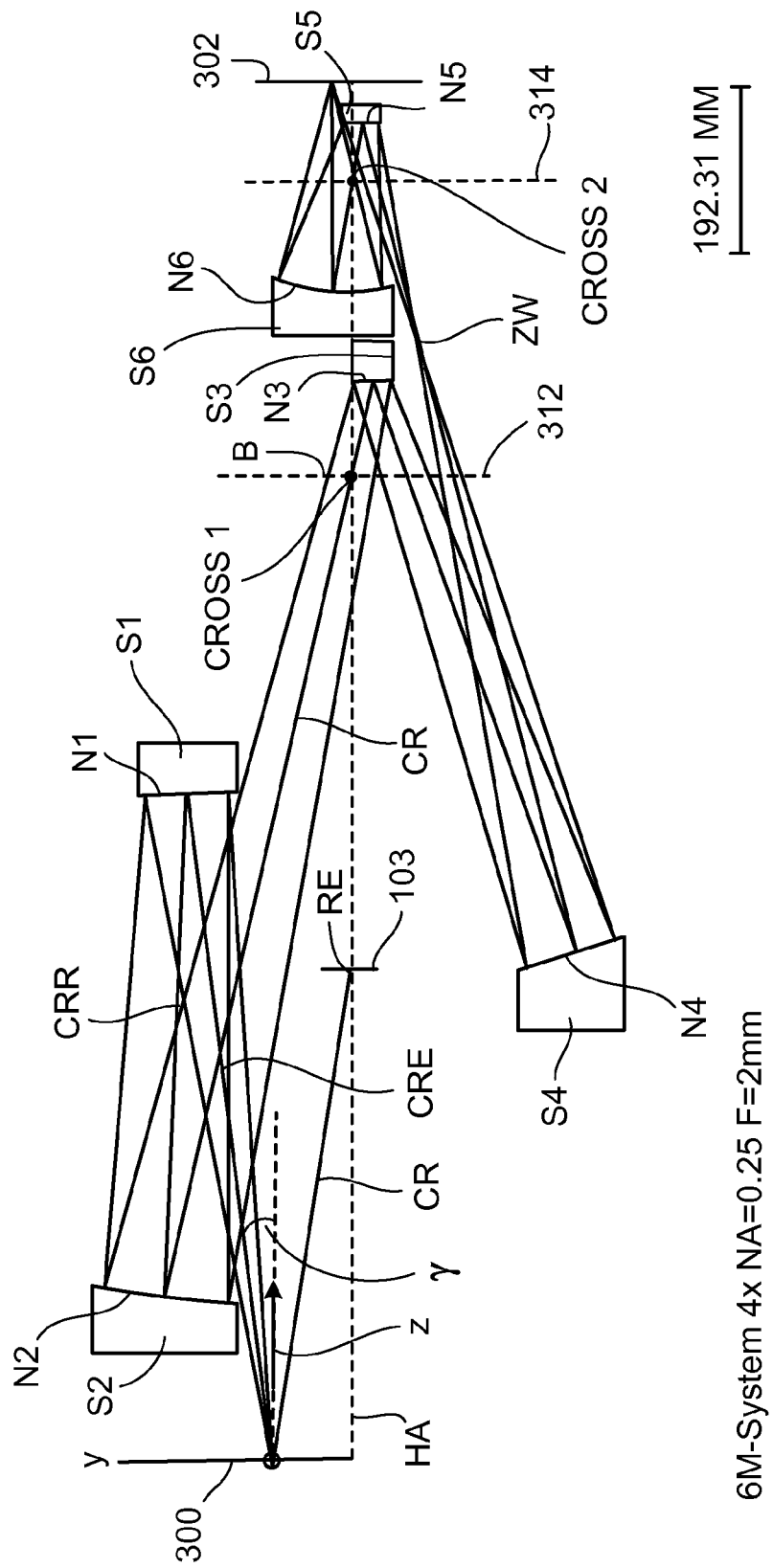

Table 3

| Surface | Radius | Thickness | Mode |
|---|---|---|---|
| Object | INFINITY | 754.640 | |
| Mirror 1 | -5445.202 | -588.928 | REFL |
| Mirror 2 | 1527.364 | 933.572 | REFL |
| STOP | INFINITY | 107.347 | |
| Mirror 3 | 409.836 | -679.913 | REFL |
| Mirror 4 | 865.334 | 976.790 | REFL |
| Mirror 5 | 293.951 | -192.058 | REFL |
| Mirror 6 | 260.341 | 238.347 | REFL |
| Image | INFINITY | 0.000 | |

| Surface | K | A | B | C |
|---|---|---|---|---|
| Mirror 1 | 0.00000E+00 | -1.49945E-10 | 1.23571E-16 | -1.55144E-21 |
| Mirror 2 | 0.00000E+00 | -6.17753E-11 | -5.41816E-17 | -2.27907E-23 |
| Mirror 3 | 0.00000E+00 | -1.56072E-08 | -4.43012E-14 | -9.64500E-18 |
| Mirror 4 | 0.00000E+00 | 2.10226E-13 | 1.05204E-17 | -1.16989E-22 |
| Mirror 5 | 0.00000E+00 | 2.01509E-08 | 1.29737E-12 | 7.05448E-17 |
| Mirror 6 | 0.00000E+00 | 2.99441E-10 | 7.97437E-15 | 1.24514E-19 |

| Surface | D | E | F | G |
|---|---|---|---|---|
| Mirror 1 | 2.24350E-26 | -2.16861E-31 | 8.59536E-37 | 0.00000E+00 |
| Mirror 2 | -3.41917E-28 | 3.46528E-34 | 0.00000E+00 | 0.00000E+00 |
| Mirror 3 | 2.83351E-21 | -7.43833E-25 | 8.56608E-29 | 0.00000E+00 |
| Mirror 4 | 6.53444E-28 | -1.70989E-33 | -1.17639E-39 | 0.00000E+00 |
| Mirror 5 | -8.59659E-21 | -2.23412E-35 | -7.32354E-28 | 0.00000E+00 |
| Mirror 6 | 3.11002E-24 | -1.98672E-29 | 2.14573E-33 | 0.00000E+00 |

Wherein:
"Surface"  
"Object" means the object plane  
Mirror 1 means the mirror S1  
Mirror 2 means the mirror S2  
Mirror 3 means the mirror S3  
Mirror 4 means the mirror S4  
"STOP" means the aperture stop  
Mirror 5 means the mirror S5  
Mirror 6 means the mirror S6

"image" means the image plane  
"radius"  
"thickness"  
"mode" characteristic of the optical surface  
"REFL" a reflective surface  
"INFINITY"  
K conical constant  
A,B,C,D,E aspherical constants

FIG. 5B

6M-System 4x NA=0.30 F=2mm

Table 4

| Surface | Radius | Thickness | Mode |
|---|---|---|---|
| Object | INFINITY | 760.433 | |
| Mirror 1 | -6594.475 | -610.443 | REFL |
| Mirror 2 | 1493.793 | 942.230 | REFL |
| STOP | INFINITY | 102.828 | |
| Mirror 3 | 418.354 | -685.204 | REFL |
| Mirror 4 | 865.237 | 968.410 | REFL |
| Mirror 5 | 289.559 | -193.382 | REFL |
| Mirror 6 | 259.676 | 235.194 | REFL |
| Image | INFINITY | 0.000 | |

| Surface | K | A | B | C |
|---|---|---|---|---|
| Mirror 1 | 0.00000E+00 | -1.54674E-10 | 1.82695E-16 | -2.03630E-21 |
| Mirror 2 | 0.00000E+00 | -5.44340E-11 | -464038E-17 | -2.42279E-23 |
| Mirror 3 | 0.00000E+00 | -1.61624E-08 | -851893E-14 | -5.35799E-18 |
| Mirror 4 | 0.00000E+00 | -6.11145E-13 | 3.34152E-17 | -2.98382E-22 |
| Mirror 5 | 0.00000E+00 | 2.14154E-08 | 1.36795E-12 | 7.70221E-17 |
| Mirror 6 | 0.00000E+00 | 3.17752E-10 | 8.28092E-15 | 1.20913E-19 |
| Surface | D | E | F | G |
| Mirror 1 | 2.19348E-26 | -1.53125E-31 | 4.46845E-37 | 0.00000E+00 |
| Mirror 2 | -1.83847E-28 | -1.56616E-36 | 0.00000E+00 | 0.00000E+00 |
| Mirror 3 | 2.02049E-22 | 0.00000E+00 | 0.00000E+00 | 0.00000E+00 |
| Mirror 4 | 1.50481E-27 | -3.45921E-33 | 0.00000E+00 | 0.00000E+00 |
| Mirror 5 | -7.03893E-21 | 0.00000E+00 | 0.00000E+00 | 0.00000E+00 |
| Mirror 6 | 3.69377E-24 | 0.00000E+00 | 0.00000E+00 | 0.00000E+00 |

Wherein:
"Surface"                                 "image"          means the image plane
"Object"     means the object plane     "radius"
Mirror 1     means the mirror S1       "thickness"
Mirror 2     means the mirror S2       "mode"       characteristic of the
Mirror 3     means the mirror S3                        optical surface
Mirror 4     means the mirror S4       "REFL"        a reflective surface
"STOP"     means the aperture stop    "INFINITY"
Mirror 5     means the mirror S5       K                conical constant
Mirror 6     means the mirror S6       A,B,C,D,E   aspherical constants

FIG. 6B

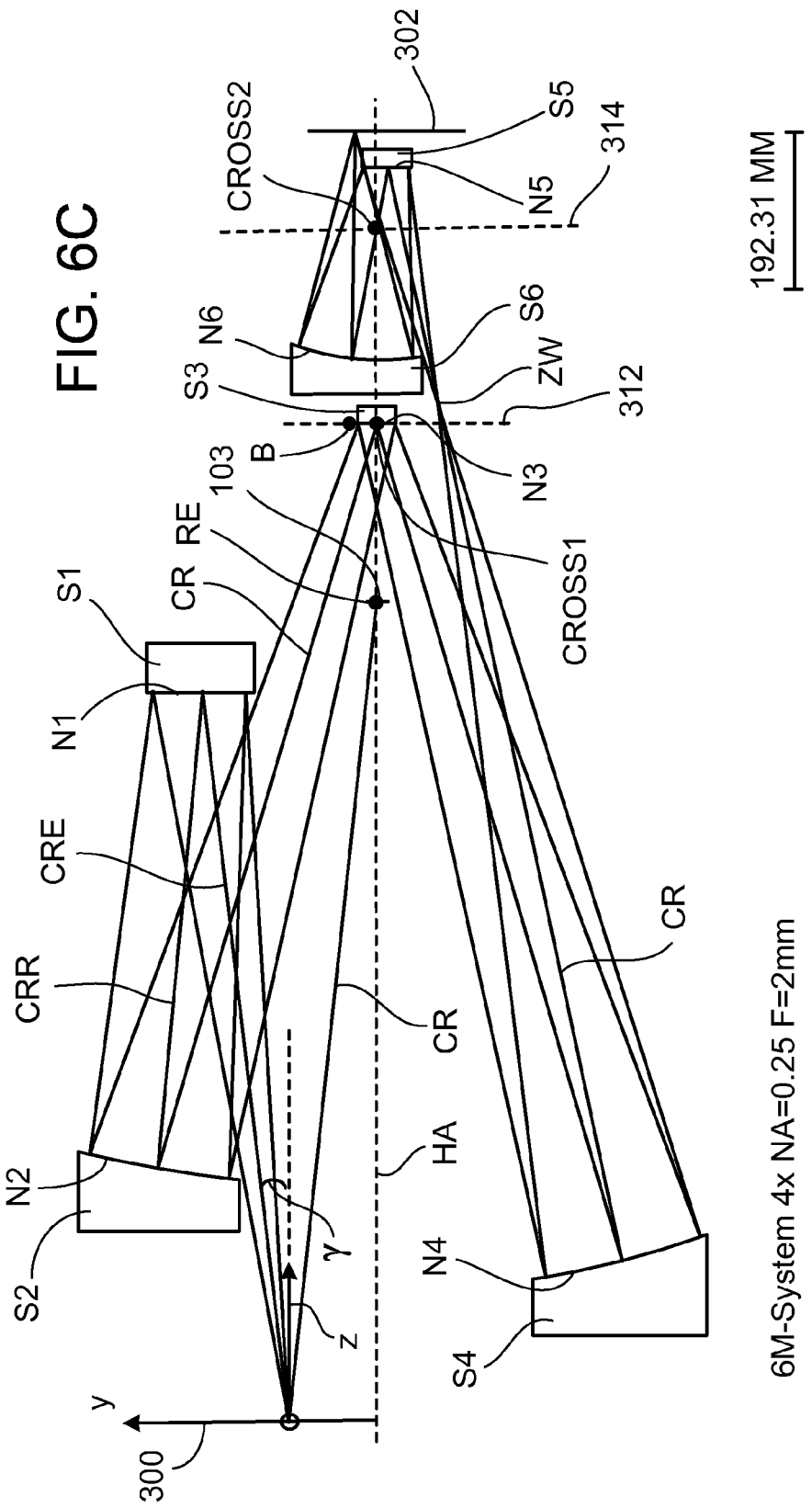

Table 5

| Surface | Radius | Thickness | Mode |
|---|---|---|---|
| Object | INFINITY | 841.190 | |
| Mirror 1 | -15965.255 | -569.221 | REFL |
| Mirror 2 | 1335.990 | 878.977 | REFL |
| STOP | INFINITY | 0.000 | |
| Mirror 3 | 326.505 | -1000.945 | REFL |
| Mirror 4 | 1155.912 | 1302.266 | REFL |
| Mirror 5 | 534.693 | -266.321 | REFL |
| Mirror 6 | 306.167 | 264.300 | REFL |
| Image | INFINITY | 0.000 | |

| Surface | K | A | B | C |
|---|---|---|---|---|
| Mirror 1 | 0.00000E+00 | -8.81260E-11 | -1.84421E-16 | 2.27798E-21 |
| Mirror 2 | 0.00000E+00 | -2.52448E-11 | -4.03936E-17 | -2.46584E-23 |
| Mirror 3 | 0.00000E+00 | -4.41990E-09 | -8.01606E-13 | -3.43875E-17 |
| Mirror 4 | 0.00000E+00 | 4.18680E-12 | 2.80690E-18 | 2.90893E-23 |
| Mirror 5 | 0.00000E+00 | 2.28753E-08 | 6.04615E-13 | 1.96262E-17 |
| Mirror 6 | 0.00000E+00 | 4.41835E-10 | 6.00081E-15 | 7.38177E-20 |

| Surface | D | E | F | G |
|---|---|---|---|---|
| Mirror 1 | -2.63123E-26 | 1.66073E-31 | -4.53482E-37 | 0.00000E+00 |
| Mirror 2 | -1.34329E-28 | 0.00000E+00 | 0.00000E+00 | 0.00000E+00 |
| Mirror 3 | 5.40919E-21 | -4.87366E-33 | 3.15160E-34 | 0.00000E+00 |
| Mirror 4 | -1.80141E-28 | 6.98855E-34 | -1.07684E-39 | 0.00000E+00 |
| Mirror 5 | -2.10000E-21 | -2.59472E-32 | 2.79150E-28 | 0.00000E+00 |
| Mirror 6 | 1.42935E-24 | -7.13172E-29 | 4.10735E-33 | 0.00000E+00 |

Wherein:
"Surface"  
"Object" means the object plane  
Mirror 1 means the mirror S1  
Mirror 2 means the mirror S2  
Mirror 3 means the mirror S3  
Mirror 4 means the mirror S4  
"STOP" means the aperture stop  
Mirror 5 means the mirror S5  
Mirror 6 means the mirror S6

"image" means the image plane  
"radius"  
"thickness"  
"mode" characteristic of the optical surface  
"REFL" a reflective surface  
"INFINITY"  
K conical constant  
A,B,C,D,E aspherical constants

FIG. 6D

PROJECTION OBJECTIVE AND PROJECTION EXPOSURE APPARATUS WITH NEGATIVE BACK FOCUS OF THE ENTRY PUPIL

CROSS-REFERENCE TO RELATED APPLICATIONS

This application claims benefit under U.S.C. §119 to U.S. provisional application No. 60/786,744, filed Mar. 27, 2006. This application also claims priority under U.S.C. §119 to German Patent Application No. 10 2006 014 380, filed on Mar. 27, 2006. The full disclosure of these earlier applications is incorporated herein by reference.

FIELD

The disclosure relates to a projection objective and a projection exposure apparatus.

BACKGROUND

An illumination system has been presented in US 2005/0088760, wherein the rays reflected from a reflective object in an object plane enter the projection objective on divergent paths. In the case of an axially symmetric projection objective which has an optical axis, this means that the projection objective has a negative back focus of the entry pupil. For axially symmetric systems, this means that a positive principal ray angle γ is present at the reflective object in the object plane. In the examples presented in US 2005/0088760, the positive principal ray angle γ is less than 7° (e.g., less than 6°).

In the case of a negative back focus of the entry pupil a mirrored entry pupil in a mirrored entry pupil plane is obtained by a mirror reflection on the object plane. The mirrored entry pupil plane lies in this case to the image side of the object plane.

A positive back focus is present if the principal ray angle γ in the object plane is negative, i.e. if the principal ray of the central field point after the reflection on a reflective object in the object plane, for example on the reflective reticle, proceeds on a path that converges towards the optical axis. In the case of a positive back focus of the entry pupil, the entry pupil of the projection objective lies to the image side of the object plane and, accordingly, the mirrored entry pupil plane lies to the opposite side of the object plane.

The back focus is determined by the distance from the object plane to the point where the principal ray directed to the central field point of the illuminated field in the object plane intersects the optical axis. With a positive principal ray angle at the object or at the reticle, for example γ=8°, and with a field radius r=125 mm, the back focus $S_{EP}$ is obtained as $S_{EP}$=−R/tan γ=−889.4 mm. In systems with a negative back focus of the entry pupil, the principal ray angle γ at the object is positive.

SUMMARY

According to a first aspect of the disclosure, a first embodiment of a microlithography projection objective with a negative back focus of the entry pupil is proposed, which includes at least two mirrors, i.e. a first mirror (S1) and a second mirror (S2), wherein the objective is designed in such a way that each principal ray CR originating from a central point of the object field and traversing the objective from the object plane to the image plane intersects the optical axis (HA) at least once in a point of intersection that is specific to that ray, with the respective points of intersection being located geometrically between the image plane of the projection objective and the mirrored entry pupil plane of the mirrored entry pupil of the projection objective. The terms "entry pupil" and "mirrored entry pupil" are explained in more detail in FIG. 1a.

According to the first aspect of the disclosure, all points of intersection of the principal rays with the optical axis of the projection objective lie between the mirrored entry pupil plane and the image plane of the projection objective.

In an advantageous embodiment, the mirrors can be arranged with rotational symmetry relative to the optical axis HA.

In an advantageous embodiment of the disclosure, the at least one point of intersection has along the optical axis a first distance A1 to the object plane, and the mirrored entry pupil has a second distance A2 to the object plane, wherein the distances A1 and A2 conform to the rule that A2 is always smaller than A1 (e.g., A2<0.9·A1, A2<0.8·A1, A2<0.7·A1, A2<0.5·A1).

An objective of this kind leaves enough design space in the area of the mirrored entry pupil to allow for example an optical element to be arranged there.

In this application a projection objective is a projection system arranged to image radiation from an object plane to an image plane with the aid of a plurality of optical elements arranged to direct radiation from the object plane to the image plane.

In particular, if a projection objective of this kind with a negative back focus of the entry pupil is used in a projection exposure apparatus, it opens the possibility for a modular design. Projection exposure apparatus consist in general of an illumination system and a projection objective. The illumination system serves to illuminate a field in an object plane, and the projection objective serves to project an image of an object that is arranged in the object plane into an image plane. In projection exposure apparatus of modular configuration, the geometry of the ray paths is chosen so that the elements of the illumination system are arranged in a first design space and the elements of the projection objective in a second design space. Thus, the illumination system forms a first module and the projection objective forms a second module. Each of the modules can be separated from the apparatus without thereby affecting the other module. For example, if the illumination system requires servicing or adjustment, one can for example exchange the illumination system without the projection system being affected by this exchange.

Furthermore, a projection exposure apparatus of this kind is distinguished by a higher transmittance, because with a negative back focus of the entry pupil it is possible to save mirrors in the illumination system, as is described in US 2005/008760.

In systems according to the disclosure, an optical element such as for example a pupil facet mirror of a double-facetted illumination system can be arranged with a negative back focus in the area of the optical axis of the projection objective, since this design space is not needed by the mirrors of the projection objective and also since no rays of the imaging ray pattern pass through the design space taken up by a facet mirror of this kind.

In some embodiments, the projection system is configured so as to avoid a grazing-incidence mirror which would otherwise be arranged in the illumination system before the object plane for the purpose of folding the ray paths. This measure likewise serves to increase the transmittance of a microlithography projection exposure apparatus in which an objective of this kind is being used.

In certain embodiments of the disclosure, the projection objective includes at least four mirrors (e.g., at least six mirrors).

In some embodiments of the disclosure, only one aperture stop plane is formed in the projection objective. The objective can be divided into a first and a second sub-objective with a first and a second number of mirrors, wherein the second sub-objective includes the aperture stop plane. The second sub-objective can have two mirrors, i.e. the fifth and the sixth mirror in an embodiment that has a total of six mirrors, while the first sub-objective comprises the first, second, third and fourth mirrors.

The image-side numerical aperture of the projection objective with negative back focus of the entry pupil according to the disclosure can meet the condition NA≧0.2 (e.g., NA≧0.25, NA≧0.3).

In one design of the projection objective, the mirror surface of the first mirror is configured as a convex mirror surface, the mirror surface of the second mirror is configured as a concave mirror surface, the mirror surface of the third mirror is configured as a concave mirror surface, the mirror surface of the fourth mirror is configured as a convex mirror surface, the mirror surface of the fifth mirror is configured as a convex mirror surface, and the mirror surface of the sixth mirror is configured as a concave mirror surface.

In order to provide the longest possible drift paths inside the objective, it is envisioned that an embodiment of the projection objective which has at least six mirrors or exactly six mirrors is subdivided into a first partial objective with a first and a second mirror, and a second partial objective with a third, fourth, fifth and sixth mirror, wherein the geometrical distance between the first partial objective and the second partial objective along the optical axis is larger than 30% of the overall length of the objective (e.g., larger than 40% of the overall length of the objective, larger than 50% of the overall length of the objective, larger than 60% of the overall length of the objective). The term "overall length of the objective" means the distance from the object plane of the projection objective to the image plane as measured along the optical axis.

In some embodiments of the disclosure it is envisioned that in a projection objective with negative back focus of the entry pupil, an incident principal ray on its way to the first mirror (CRE) of the projection objective travels in the meridional plane of the projection objective on a path between the principal ray reflected from the mirror surface (CRR) and the optical axis (HA) of the projection objective. This is shown in FIG. 1h. Both the incident principal ray (CRE) as well as the reflected principal ray (CRR) are in this case associated with the same field point, for example the central field point.

With the principal ray traveling from the object plane to its incidence on the first mirror (CRE) on a path that runs in the meridional plane of the projection objective between the principal ray reflected from the mirror surface (CRR) and the optical axis (HA) of the projection objective, one achieves the benefit that enough design space is available particularly in the anterior part of the objective for the installation of an optical element, for example the pupil facet mirror of the illumination system or a grazing-incidence mirror.

In an alternative embodiment of the projection objective it can be envisioned that at least one intermediate image may be formed in the light path from the object plane to the image plane.

In an alternative embodiment of a projection objective with negative back focus of the entry pupil, the objective is designed so that in a meridional plane of the projection objective the light path from the object plane to the first mirror (S1) crosses the light path from the second mirror (S2) to the image plane and that no further mirror is placed between the object plane and the first mirror (S1).

The term "meridional plane" in the present context means the plane that contains the optical axis (HA) of the projection objective and the central field point of the field in the object plane. Advantageously, the light path in the projection objective crosses over itself in the part of the objective that lies closest to the object plane. This part of the projection objective comprises those mirrors which have a short distance to the object plane in which the reticle is arranged. The light bundle which proceeds from the object to the first mirror can cross the light bundle which travels from the second to the third mirror. This makes it possible that in particular the second mirror can be arranged at a large distance from the optical axis. The aperture stop can be arranged between the second and the third mirror and has a large axial distance from the object plane, as does the third mirror.

A projection objective of this kind can contain four mirrors. In some embodiments, a projection objective of this type can contain six mirrors.

In the projection objectives according to the disclosure with a negative back focus of the entry pupil, the large distance of the first and second mirrors from the optical axis makes it possible to arrange an optical element, specifically an optical integrator, at or close to the point of intersection of the optical axis with the principal ray (CR) that is directed to the central field point.

In contrast to the systems with negative back focus that have been disclosed in US 2005/0088760, the embodiments of projection objectives according to the disclosure no longer require a mirror to be arranged before the object plane for the purpose of folding the light path. The transmittance of the system is thereby significantly increased. Furthermore, by using a projection objective of this kind in a projection exposure apparatus, one avoids a cross-over between the light paths in the illumination system and in the projection system, so that the projection exposure apparatus can have a modular design with regard to its spatial arrangement and technical construction.

In some embodiments of a projection objective that has an intermediate image, the latter can be formed between the fourth and the fifth mirror of the objective, if the objective contains six mirrors.

In certain embodiments where the projection objective with negative back focus in accordance with the disclosure is configured as an objective that contains six mirrors, the mirror surface of the first mirror is concave-shaped, the mirror surface of the second mirror is concave-shaped, the mirror surface of the third mirror is convex-shaped, the mirror surface of the fourth mirror is concave-shaped, the mirror surface of the fifth mirror is convex-shaped, and the mirror surface of the sixth mirror is concave-shaped.

The aperture stop can be arranged between the second and the third mirror. The image-side numerical aperture NA of the projection objective can be more than 0.2 (e.g., more than 0.25, more than 0.3).

In some embodiments, the objective according to the disclosure is a catoptric projection objective with a negative back focus of the entry pupil, an image-side wave front aberration $W_{RMS}$ of less than 0.01λ and on each of the mirrors a maximum angle of incidence smaller than 21°. The image-side wave front aberration can be $W_{RMS} \leq 0.07\lambda$ (e.g., $W_{RMS} \leq 0.06\lambda$). The maximum angle of incidence in the meridional plane on each of the mirrors can be ≦20°. The symbol λ stands here for the wavelength of the light which traverses the projection objective along an imaging light path from the object plane to the image plane.

The projection objective in certain embodiments has at least four mirrors, wherein the first and the fourth mirror in a light path from the object plane to the image plane are convex mirrors.

The maximum mirror diameter of all mirrors in the meridional plane can be <190 mm (e.g., <180 mm).

All of the afore-named individual measures such as for example the size of the aperture, the number of mirrors of an objective, angle of incidence, mirror diameter etc. can be arbitrarily combined for all of the embodiments shown here without thereby deviating from the subject of the disclosure. All of these combinations are within the scope of what is being disclosed about the disclosure.

In addition to the microlithography projection objective the disclosure also provides a microlithography projection exposure apparatus. The microlithography projection exposure apparatus according to the disclosure includes an illumination system that is traversed by an illumination light bundle, and it further includes an object plane in which an object field is illuminated, and a projection objective, wherein the latter is traversed by an imaging light path from the object plane to the image plane and wherein the projection objective has an entry pupil with negative back focus. The microlithography projection exposure apparatus is designed so that the illumination light bundle which travels to the object plane from an optical component of the illumination system that is in the next-to-last position in the light path does not cross the imaging light path in a meridional plane except in the vicinity of the reflective object, i.e. at the reticle.

In a projection exposure apparatus with negative back focus of the entry pupil, it is possible to arrange an optical element, for example parts of the optical integrator, or for example the second facetted optical element—the so-called pupil facet mirror, in the area of the mirrored entry pupil. As a result, the optical imaging element for producing an image of the second facetted optical element can be omitted.

This makes it possible to specify microlithography projection exposure apparatus which in accordance with the disclosure are designed so that the transmittance is increased in comparison to known projection exposure apparatus of the state of the art with positive back focus. The term "transmittance" means that portion of the light which is emitted by the light source, passes through the microlithography projection exposure apparatus, and falls on the image plane in which the object to be projected is arranged. The number of mirrors in a microlithography projection exposure apparatus is of particular significance for the transmittance, because the reflectance of the multi-layer mirrors at EUV wavelengths is at most around 70%. If a microlithography projection exposure apparatus of a first design contains two mirrors more than a microlithography projection exposure apparatus of a second design, the transmittance in the microlithography projection exposure apparatus of the first design is reduced by the two additional mirrors approximately by a factor of 2 in comparison to the second design as the reflectance of each of the two mirrors is about 70%.

Since the respective paths of the illumination light rays and of the projection light rays are no longer crossing each other, a modular design becomes possible for the overall design of the system according to the disclosure, meaning that the illumination system can be separated from the projection objective with regard to its spatial arrangement and technical construction. The modular design is achieved by arranging the elements of the illumination system in a first design space and the elements of the projection objective in a second design space. In microlithography projection apparatus of this kind, there are very simple ways of separating the illumination system from the projection objective.

In a first embodiment of the disclosure, the layout of the projection objective is designed in such a way that the projection objective has no intermediate image in the light path from the object plane to the image plane. In an alternative embodiment, the objective has a cross-over of the ray paths in that part of the objective that is closest to the object plane, i.e. has a shorter geometrical distance to the object plane.

The illumination system of a microlithography projection exposure apparatus which comprises an objective with a negative back focus of the entry pupil can be configured in different ways.

Thus, a first embodiment can be designed in which the illumination system is a double-facetted illumination system.

A double-facetted illumination system is distinguished by having a first facetted mirror with a multitude of first facets, so-called field facets, as well as a second facetted mirror with a multitude of second facets, so-called pupil facets. As described above, a system of this kind has the second facetted element with pupil facets arranged in or near the mirrored entry pupil of the projection objective. The pupil facet mirror in some embodiments can have about 200 to 300 pupil facets which, as an option, can be designed so that they are switch-controlled whereby the correlation of the first facets to the second facets can be changed. A change in the correlation of the first to the second facets for the adjustment of the setting can be achieved in a double-facetted illumination system for example by exchanging the first facetted optical elements with field facets. In systems that are designed for a wavelength ≦193 nm (e.g., for wavelengths ≦100 nm, for wavelengths in the range of EUV wavelengths of 10 to 30 nm), the facets are designed as reflectors, i.e., mirrors.

Instead of a double-facetted illumination system, it is also possible to specify an illumination system where a diffuser is arranged in or near the mirrored entry pupil of the projection objective. A diffuser of this kind can for example have a multitude of diffusion centers. These diffusion centers can for example be constituted by 500 to 1000 or more small mirror facets which are arranged on a carrier, or the diffusion centers can be formed by a holographic lattice. Light that falls on this diffuser is scattered in all directions by the diffusion centers.

Due to the arrangement of the diffusion centers—primarily in a round or slightly oval form—a light source is produced which scatters the incoming light from the light source in the predetermined shape, namely in an arcuate shape, into large solid-angle elements.

This kind of a design with a diffuser plate has the advantage that, in contrast to a double-facetted illumination system, one fewer optical element needs to be used for the illumination of the field in the object plane and for the illumination of a pupil plane, whereby the transmittance is increased in comparison to the double-facetted illumination system.

To control the setting of the illumination in a pupil plane, the design may include that an aperture stop is placed in the light path before or after the diffuser.

A particularly advantageous embodiment of an illumination system may include a location-variant or field dependent C or optical integrator for the illumination of the field plane as well as of a pupil plane or a conjugate pupil plane. A diffuser of this kind is also referred to as a specular reflector. Since the specular reflector does not need to be arranged in the pupil plane or in a conjugate plane associated with the pupil plane, the microlithography projection exposure apparatus can be designed in such a way that the diffuser is optimally placed in relation to other system components in the light path in the light path. The diffuser can be of a size that makes it simple to produce the individual facets with a high accuracy of their angles. The size of the mirror facet can be larger than 2 mm (e.g., larger than 3 mm, larger than 5 mm).

For an optimal, i.e. largely loss-free, illumination of the diffuser which can be designed in a kidney shape, it is intended to place an optical component before the diffuser in the light path from the light source to the diffuser, more specifically a normal incidence mirror which can be configured as a free-form surface with an off-axis conical component. A mirror of this kind is a part of a cone which does not include the cone axis. When an extra-axial segment of a cone of this kind is illuminated, one obtains a not quite complete annular illumination which largely matches the kidney shape of the diffuser.

Placing a normal-incidence mirror ahead in the light path has the further advantage of providing a filtering effect. The multi-layered coating of the normal-incidence mirror reflects in essence only the radiation in the usable part of the wavelength spectrum and thus has the result that only useful light arrives at the diffuser, i.e., light in the wavelength range of for example $\lambda=13.5$ for EUV systems. The filtering effect of the multi-layered mirror is independent of the shape of the mirror.

If the individual facets of the diffusers are to be configured as planar mirrors, a design that offers advantages in the manufacturing process, it is possible to arrange an optical element, more specifically a normal-incidence mirror in the light path after the diffuser. With this arrangement, the normal-incidence mirror that is placed behind the diffuser, projects a strongly magnified image of the light source into the object plane that contains the object which is to be illuminated. The location-variant or field dependent diffuser produces in this object plane a multitude of images of the source which are superimposed on each other. If the normal-incidence mirror is in addition designed to have refractive power, it is possible to set the scale ratio of the image by means of the normal-incidence mirror. As a result, one always obtains the same illumination in a pupil plane independent of the size of the location-variant or field dependent diffuser, based on the set imaging scale ratio.

This makes it possible to design the diffuser in a very large size, which has the advantage that due to the large surface the radiation exposure of the diffuser is reduced and the thermal stress on the diffuser is thereby reduced.

Instead of the afore-described mirror with a free-form surface with an off-axis conical component, the kidney-shaped illumination of the location-variant or field dependent diffuser can also be obtained by giving a kidney-shaped design to the collector that collects the light of the light source and reflects it onto the diffuser. Due to the small number of reflections, this concept provides a particularly efficient illumination system with a high transmittance. In some embodiments, a grazing-incidence collector can be used as collector of the microlithography projection exposure apparatus, and the ray pattern in the illumination system does not include an intermediate image. This allows the diffuser to be arranged directly before the reticle.

BRIEF DESCRIPTION OF THE DRAWINGS

Examples of embodiments of the disclosure are hereinafter described and illustrated in drawings, wherein FIG. 1a serves to visualize the negative back focus of the entry pupil, FIG. 6c shows a second alternative system of a projection objective according to the second embodiment, FIG. 6d consists of Table 5.

Figure 1A:
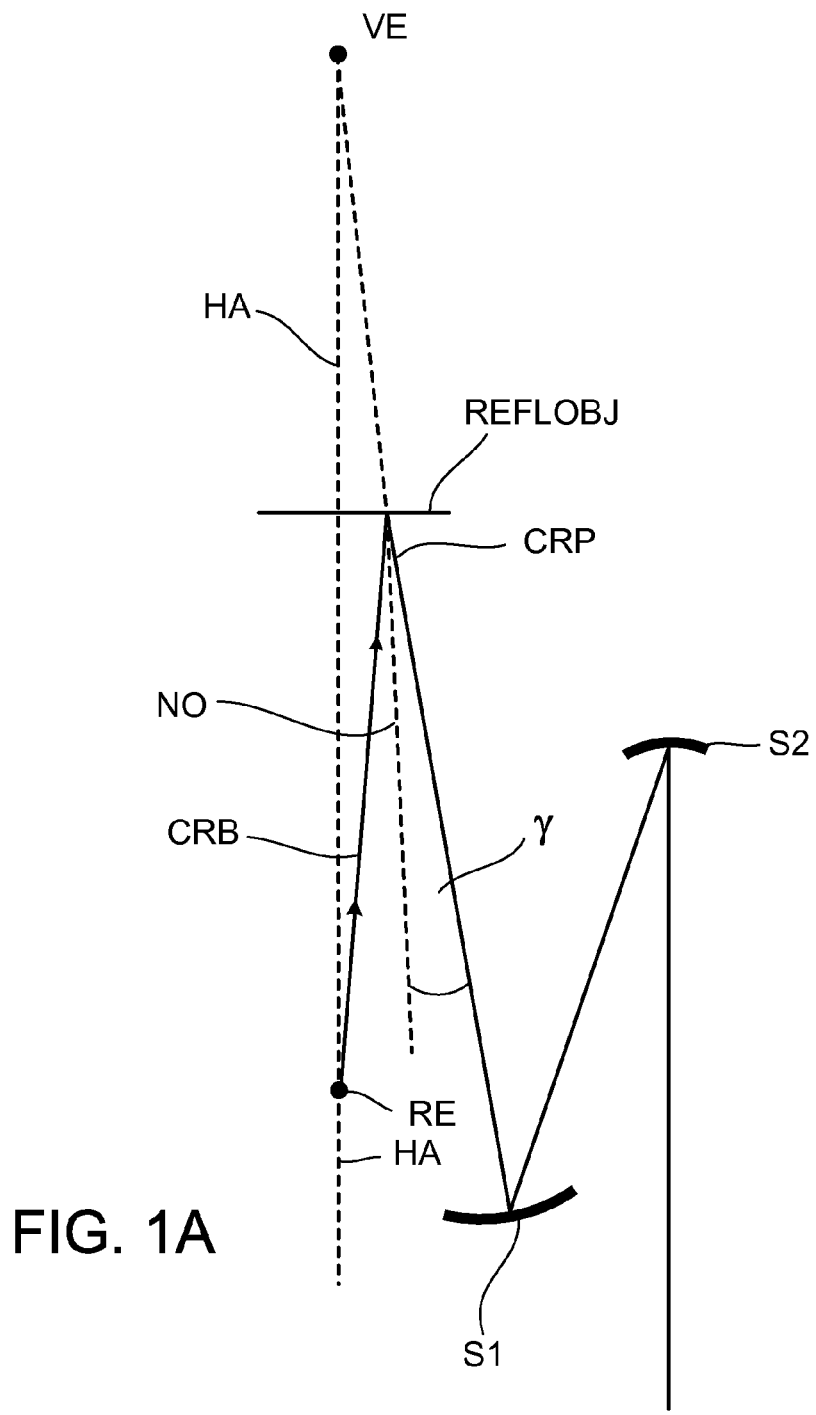
FIG. 1b represents a schematic view of a microlithography projection exposure apparatus.
FIG. 1c represents a cone of rays for the definition of the image-side numerical aperture.
FIG. 1d represents a part of a mirror surface in a meridional section.
FIG. 1e represents a part of a mirror surface in a plane that is orthogonal to the meridional plane.
FIG. 1f shows the shape of a ring field.
FIG. 1g shows a microlithography projection exposure apparatus according to the state of the art as described in US 2005/088760 with a projection objective with negative back focus of the entry pupil.
FIG. 1h is a schematic illustration to explain the geometry of the ray path in the vicinity of the first mirror.

The disclosure will now be described by referring to the drawings which represent examples without implying any limitations.

DETAILED DESCRIPTION

FIG. 1a to 1h will be referred to in the following detailed description of the general concepts which are used in all of the embodiments and relate to all of the illustrated examples.

FIG. 1a serves to visualize the concept which is referred to herein as negative back focus.

Figure 1B:
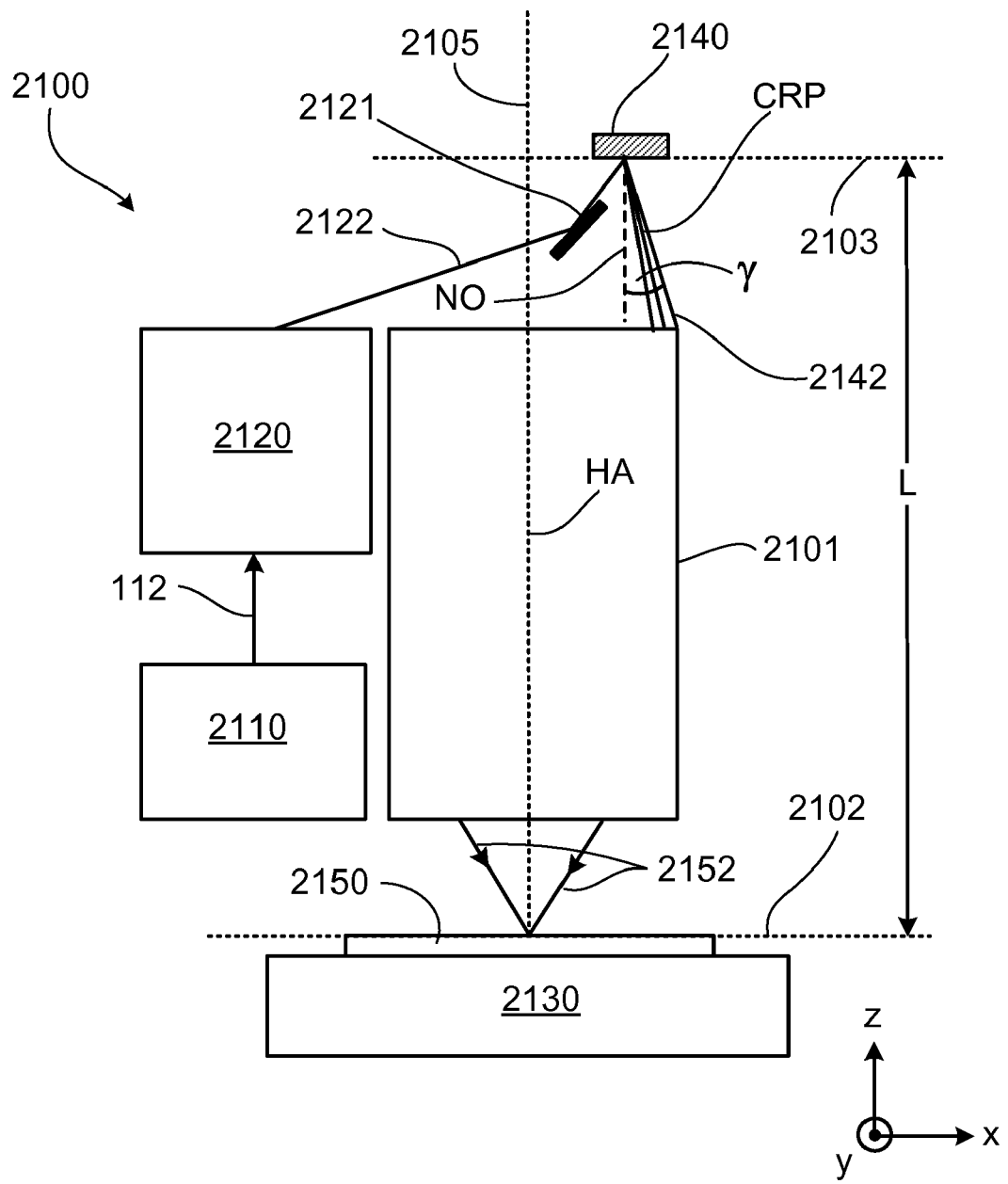
Figure 1C:
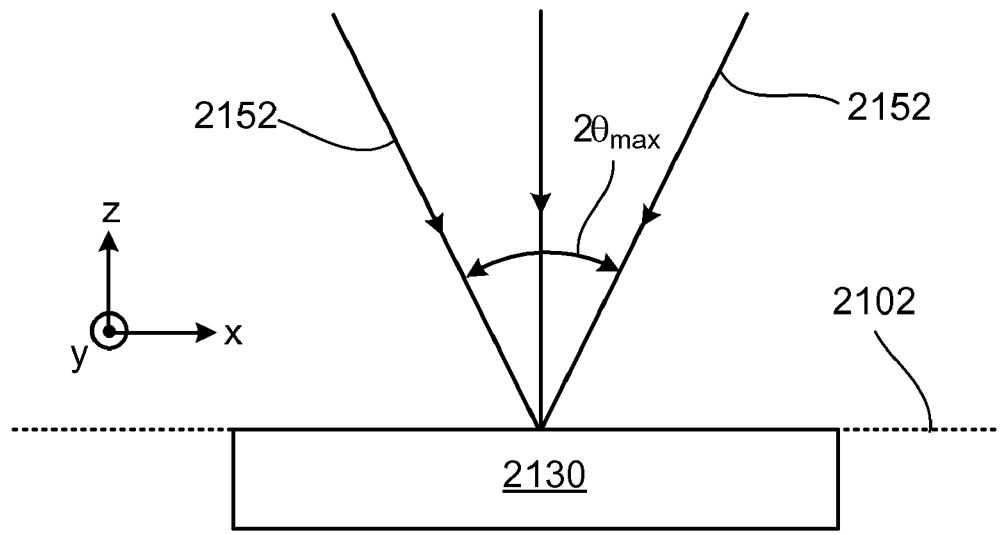
Figure 1D:
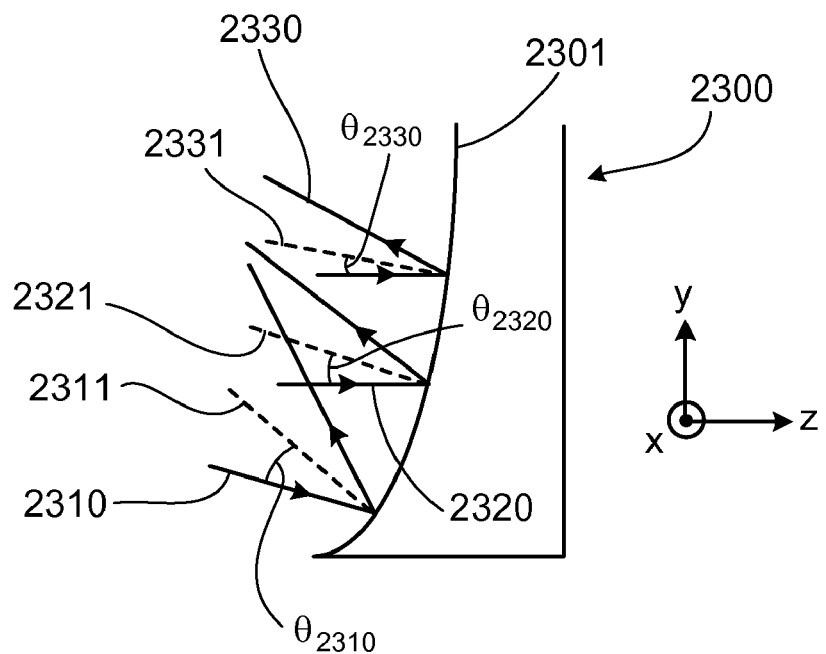
Figure 1E:
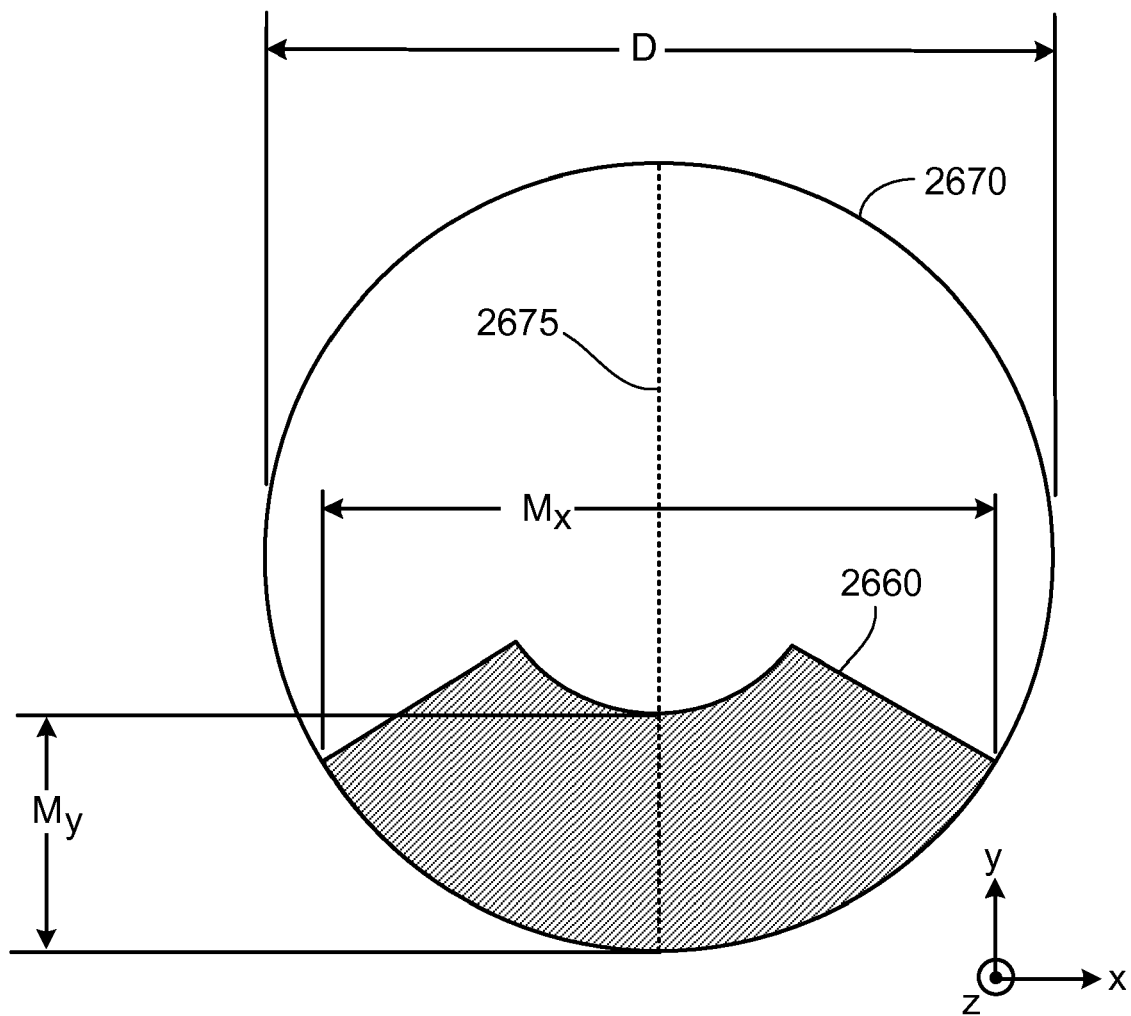
Figure 1F:
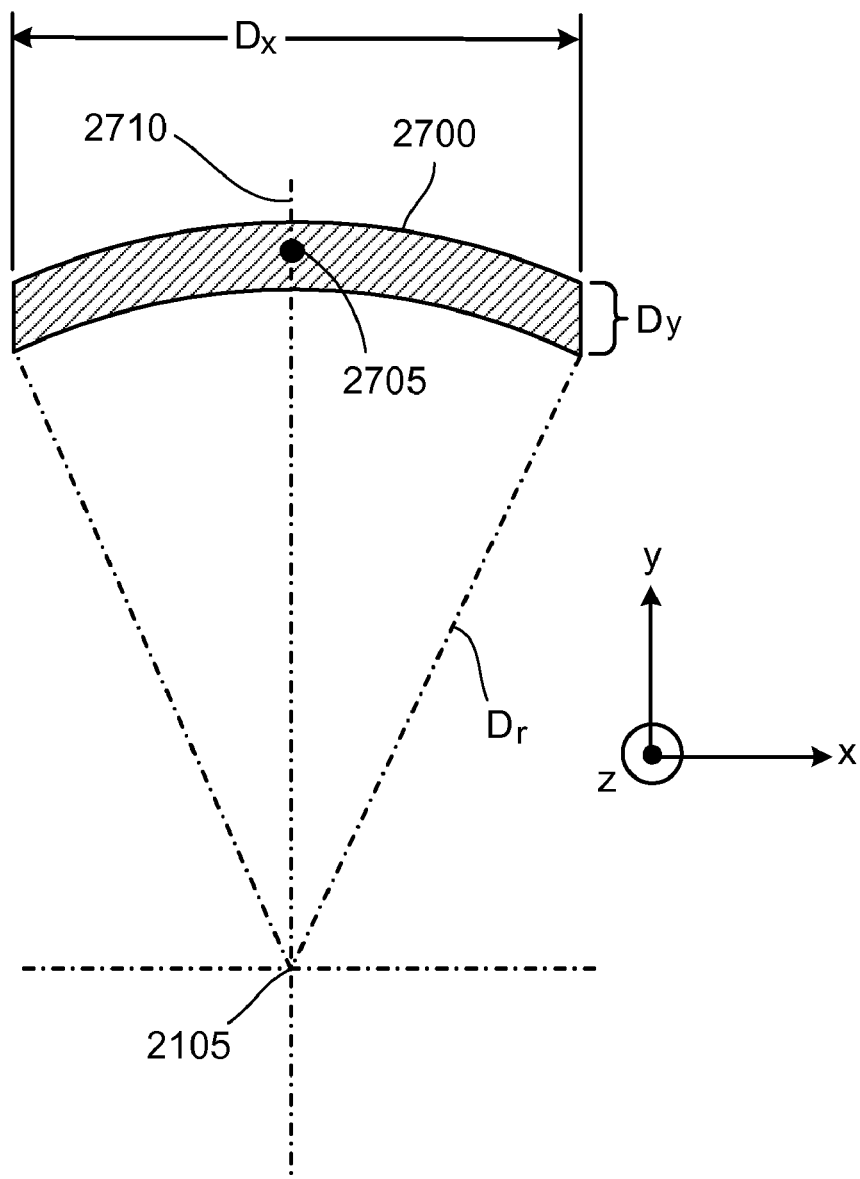

FIG. 1a shows the principal ray CRB of an illumination light bundle directed at the central field point of an illuminated field as illustrated for example in FIG. 1f. As shown here, the principal ray CRB of the illumination light bundle reflected on a reflective object REFLOBJ, for example a reticle and, now as principal ray of a projection light bundle, enters into a projection objective of which the first mirror S1 and the second mirror S2 are shown in the drawing. "Negative back focus of the entry pupil" means that the principal ray angle γ at the reflective object, for example the reticle, is positive. The principal ray angle γ is the angle by which the principal ray CRP is inclined relative to the normal direction NO of the reflective object REFLOBJ. For systems with negative back focus of the entry pupil, the angle γ is by definition positive and is measured counterclockwise.

The mirrored entry pupil RE is obtained by mirroring the entry pupil VE at the object plane in which the reflective object REFLOBJ is arranged. With a negative back focus of the entry pupil VE, the mirrored entry pupil RE is formed to the image side of the object plane. In other words: the mirrored entry pupil RE and the image plane, in which e.g. the wafer is situated, lie on the same side with respect to the object plane.

FIG. 1b represents a microlithography projection exposure apparatus 2100. The latter contains a light source 2110, an illumination system 2120, a projection objective 2101 as well as a support structure or work surface 2130. Further shown is a Cartesian coordinate system. The radiation of the light source 2110 is directed to an illumination system 2120. The illumination system 2120 has an influence on the radiation originating from the light source 2110, for example by homogenizing the radiation or by directing a ray bundle 2122 of the radiation for example by means of the illustrated direction-changing mirror 2121 onto a mask 2140 which is positioned in an object plane 2103. The projection objective 2101 projects the radiation that is reflected by the mask 2140 onto a substrate surface 2150 which is positioned in an image plane 2102. The ray bundle 2142 on the object side has according to the disclosure a principal ray CRP with a positive principal ray angle γ. Also indicated in the drawing is the surface-normal direction NO of the object plane 2103 in the vicinity of the mask 2140. The substrate 2150 is supported or carried by a support structure 2130, wherein the support structure 2130 moves the substrate 2150 relative to the projection objective 2101, so that the projection objective 2101 projects images of the mask 2140 onto different areas of the substrate 2150.

The projection objective 2101 includes an optical axis 2105. As shown in FIG. 1a, the projection objective 2101 projects a part of the mask 2140 that does not contain the optical axis of the projection objective 2101 into an image plane 2102. The light source 2110 is selected in such a way that it provides electromagnetic radiation at an operating wavelength λ that is used to operate the microlithography projection exposure apparatus. In some of the examples described, the lights source 2110 is a laser plasma source or a plasma discharge source that emits EUV radiation. As alternatives, it is also possible to use light sources that are used for other wavelengths, such as for example light-emitting diodes (LEDs) which emit radiation in the blue or UV range of the electromagnetic spectrum, for example at 365 nm or 248 nm, respectively. This can be for systems in which broad-band light sources are used together with mirror systems.

The operating wavelength λ of the microlithography projection exposure apparatus lies in the ultraviolet or extreme ultraviolet (EUV) range of the electromagnetic spectrum. The operating wavelength can for example be 193 nm or less, especially 100 nm or less. In the examples of embodiments described herein, the operating wavelength can for example be in the range of 193 nm (e.g., in the range of 157 nm, in the EUV range of wavelengths, such as 13 nm).

It is especially desirable to use radiation of a particularly short wavelength, because the optical resolution of a projection objective is generally in proportion to the operating wavelength being used. This is the reason why with the use of shorter wavelengths, projection objectives are capable of resolving smaller structures of an image than can be resolved by projection objectives that are of the same kind but use longer wavelengths.

The illumination system 2120 comprises optical components which produce a collimated light beam with a largely homogeneous intensity profile. The illumination system 2120 further comprises optical arrangements that serve to direct the light bundle 2122 onto the mask 2140. In some embodiments, the illumination system 2120 further includes components which produce a specific polarization profile of the ray bundle.

The image plane 2102 has a distance L from the object plane 2103 which is also referred to as the overall length B of the projection objective 2101.

In the examples of embodiments that are described herein, the overall length is in the range from one meter to about three meters (e.g., in the range from about 1.3 m to 2.5 m).

In certain examples of embodiments, the overall length is shorter than 2 m (e.g., shorter than 1.9 m, shorter than 1.8 m, shorter than 1.7 m, shorter than 1.6 m, shorter than 1.5 m).

The projection objective 2101 has an imaging factor that applies to the ratio of the dimensions of the field in the object plane 2103 in relation to the corresponding dimensions of the projected field in the image plane 2102. Typically, the projection objectives that are used in lithography systems are reducing projection objectives, meaning that the dimensions of the image are smaller than those of the object. In some examples, it is therefore possible for the projection objective 2101 to produce a field in the image plane 2102 with image dimensions that are reduced by a factor of 2 to 10 (e.g., by a factor 4 or 5), in comparison to the dimensions in the object plane 2103. However, it is also possible to develop projection objectives which provide a magnified image or an image of the same size as the object.

FIG. 1c shows the marginal rays 2152 of the light bundle which projects the object into the image plane 2102. The marginal rays 2152 define a cone of rays.

The angle of the cone of rays is related to the image-side numerical aperture (NA) of the projection objective 2101. The image-side numerical aperture can be expressed as $NA = n_0 \cdot \sin \Theta_{NA}$, wherein no stands for the refractive index of the medium that lies adjacent to the substrate 2150. This medium can be for example air, nitrogen, water, or a vacuum. The symbol $\Theta_{NA}$ stands for the angle that is defined by the marginal rays of the projection objective 2101.

In general, projection objectives 2101 have a relatively large numerical aperture NA on the image side. To give an example, the image-side numerical aperture NA of the projection objective 2101 in some embodiments is larger than 0.15, in particular more than 0.20, and even larger than 0.25.

The optical resolution of the projection objective 2101 generally varies as a function of the wavelength and the image-side numerical aperture NA.

The relationship between the resolution of a projection objective and the wavelength and the image-side numerical aperture can be estimated with the formula $$R = k \cdot \frac{\lambda}{NA},$$

wherein R stands for the minimal resolution of the projection objective and k is a dimension-less factor which is referred to as process factor. The process factor k varies as a function of different factors, for example the polarization properties of the image projection or the selected modes of illumination. The process factor k lies typically in the range from 0.4 to 0.8 but can also be below 0.4 or above 0.8 for special applications.

The projection objective 2101 in some embodiments has a relatively high resolution, meaning that the numerical value of R is relatively small. For example, the resolution R can have a value of 150 nm or less (e.g., 130 nm or less, 100 nm or less, 75 nm or less, 50 nm or less, 40 nm or less, 35 nm or less, 32 nm or less, 30 nm or less, 28 nm or less, 25 nm or less, 22 nm or less, 20 nm or less, 18 nm or less, 15 nm or less, 14 nm or less, 13 nm or less, 12 nm or less, 11 n nm or less, 10 nm or less). The quality of an image that is formed by the projection objective 2001 can be quantified in different ways.

For example, images can be characterized or their quality level can be quantified based on the measured or calculated deviations of the image from an ideal image point. These deviations are generally referred to as aberrations. A measure that is used to quantify the aberrations of a wave front from the ideal or desired form is known as the root-mean-square wave front aberration or RMS value $W_{RMS}$. A definition of $W_{RMS}$ is given for example in "Handbook of Optics", Vol. 1, $2^{nd}$ part, edited by Michael Bass (McGraw Hill), Inc. 1995, on page 35.3. As a general rule, the lower the W s-value for an objective, the less the wave front deviates from the desired or ideal form, and the better is the quality of the image.

In some embodiments, the projection objective 2101 has very small $W_{RMS}$-values of the image in the image plane 2102. For example, a projection objective 2101 can have a $W_{RMS}$-value of about 0.1·λ or less (e.g., 0.07·λ, less than 0.07·λ, less than 0.06·λ, less than 0.05·λ, less than 0.045·λ, less than 0.04·λ, less than 0.035·λ, less than 0.03·λ, less than 0.025·λ, less than 0.02·λ, less than 0.015·λ, less than 0.01·λ, less than 0.008·λ, and less than 0.006·λ).

Another measure that can be used to evaluate the quality of an image is curvature of the image field, referred to as field curvature. The field curvature is defined as the peak-to-valley variation in the axial position of the focal plane as a function of the field point, in other words the maximum field variation of the focal plane. In some embodiments, the projection objective 2101 has a relatively small image field curvature for images in the image plane 2102. To mention examples, the projection objective 2101 has an image field curvature of less than 20 nm (e.g., less than 15 nm, less than 12 nm, less than 10 nm, less than 9 nm, less than 8 nm, less than 7 nm, less than 6 nm, less than 5 nm, less than 4 nm, less than 3 nm, less than 2 nm, less than 1 nm).

Another measure that can be used to evaluate the optical performance of a projection objective is the distortion. The distortion is defined as the maximum absolute value of the field-point-dependent deviation of the image point from the ideal position of the image point in the image plane. The projection objective in some examples has a relatively small distortion of 10 nm or less (e.g., 9 nm or less, 8 nm or less, 7 nm or less, 6 nm or less, 5 nm or less, 4 nm or less, 3 nm or less, 2 nm or less, 1 nm or less).

The projection objective can be a catoptric projection objective or a catadioptric projection objective. A catoptric projection objective has exclusively reflective optical element such as for example mirrors. Catadioptric systems have reflective as well as refractive optical elements.

If the objective is configured as a catoptric system, it contains a multitude of mirrors which are arranged so that the radiation that travels from a mask 2140 to a substrate 2150 is reflected in such a way that an image of the mask 2140 is formed on the surface of the substrate 2150. Special design versions of a projection objective are configured as described in the following paragraphs. Generally speaking, the number, size and structure of the mirrors is determined by the desired optical properties of the projection objective 2101 and the physical boundary conditions of the projection exposure apparatus 2100.

The number of mirrors in the projection objective 2101 can vary. Typically, the number of mirrors is tied to different requirements that are imposed on the optical properties of the objective.

In certain embodiments, the projection objective 2101 has at least two mirrors (e.g., at least four mirrors, at least five mirrors, at least six mirrors, at least seven mirrors, at least eight mirrors). In certain embodiments of the disclosure in which mirrors of the objective are arranged between the object plane and the image plane, the projection objective 2101 has an even number of mirrors, for example four, six or eight mirrors.

The projection objective 2101 generally comprises one or more mirrors of positive optical refractive power. This means in other words that the reflecting part of the mirror has a concave surface and is accordingly referred to as a concave mirror or concave-shaped mirror. The projection objective 2101 can contain two or more, for example three or more, and in particular four or more concave mirrors. The projection objective 2101 can also include one of more mirrors that have negative optical refractive power. This means that one or more of the mirrors have a reflecting portion with a convex surface. Mirrors of this kind are also called convex mirrors or convex-shaped mirrors. In some embodiments, the projection objective 2101 can have two or more, in particular three or more, and most particularly four or more convex mirrors.

In certain embodiments, the mirrors are arranged in the projection objectives 2101 in such a way that the radiation that originates from the object plane 2103 forms one or more intermediate images.

Embodiments of the disclosure that have one or more intermediate images contain two or more pupil planes. In some embodiments, an aperture stop is arranged in a physically accessible way in at least one of these pupil planes.

The mirrors are generally configured in such a way that a large proportion of the light of the operating wavelength of the projection objective that falls on the mirror surface at an angle or within an angular range is substantially being reflected. The mirrors can also be configured so that of the radiation with a wavelength λ that falls on the mirror surface, for example more than 50% is reflected (e.g., more than 60% is reflected, more than 70% is reflected, more than 80% is reflected, more than 90% is reflected). In some embodiments, the mirrors are coated with a stack of multiple layers, a so-called multi-layer stack in which the layers consist of different materials and the stack is designed so that is substantially reflects the radiation of the wavelength λ that falls on the surface. Every coating film of the stack has an optical thickness of approximately λ/4. The multi-layer stacks can comprise 20 or more layers (e.g., 30 or more layers, 40 or more layers, 50 or more layers). The multi-layer system consists for example of sets of multiple alternating layers consisting of molybdenum and silicon or molybdenum and beryllium, in order to form mirrors that reflect radiation in the range of wavelengths from 10 nm to 30 nm, for example radiation with a wavelength λ of 13 nm or 11 nm.

The mirrors in certain embodiments are made of quartz glass and coated with a single layer of aluminum. The latter, in turn, is overlaid with dielectric layers that comprise materials such as $MgF_2$, $LaF_2$, $Al_2O_3$, for example for wavelengths of about 193 nm.

In general, the part of the radiation that is reflected by a mirror varies as a function of the angle of incidence of the radiation on the mirror surface. As the image-producing radiation is propagated along a multitude of different paths in a catoptric projection objective, the angle of incidence of the radiation can vary between mirrors. This is illustrated in FIG. 1d which shows a part of a mirror 2300 in a sectional view along the meridional plane. The mirror 2300 contains a concave reflective mirror surface 2301. The image-producing radiation which reaches the surface 2301 along different paths includes for example the paths that are represented by the rays 2310, 2320, 2330. The rays 2310, 2320, 2330 fall on a part of the mirror surface 2301. The surface-normal directions on the surface of the mirror vary in this part of the mirror surface 2301 and are represented by the lines 2311, 2321 and 2331 for the points of incidence of the rays 2310, 2320 and 2330. The rays 2310, 2320 and 2330 meet the surface under the angles $\Theta_{2310}$, $\Theta_{2320}$ and $\Theta_{2330}$, respectively.

For every mirror in the projection objective 2100, it is possible to represent the angles of incidence of the image-producing rays in a multitude of ways. One possible form of representation is through the respective maximum angle of the rays that fall on each mirror in the meridional section of the projection objective 2101. This maximum angle is referred to as $\Theta_{max}$. In general, the angle $\Theta_{max}$ can vary between different mirrors of the projection objective 2101. In certain embodiments of the disclosure, the overall maximum value $(\Theta_{max})_{max}$ for all mirrors of the projection objective 2101 is 60° or less (e.g., 55° or less, 50° or less, 45° or less). In some examples, the overall maximum angle $(\Theta_{max})_{max}$ is relatively small, for example 40° or less (e.g., 35° or less, 30° or less, 25° or less, 20° or less).

As another possibility, the incident light on a mirror can be characterized through the angle of incidence on each mirror in the meridional section for the principal ray of the central field point of the field to be illuminated in the object plane. This angle is referred to as $\Theta_{CR}$. Concerning the principal ray angle $\Theta_{CR}$, reference is also made to what has been said hereinabove in the introductory part. It is again possible to define a maximum angle $\Theta_{CR(max)}$ in the projection objective as the maximum principal ray angle of the central field point. This angle $\Theta_{CR(max)}$ can be relatively small, for example smaller than 40° (e.g., smaller than 35°, smaller than 30°, smaller than 25°, smaller than 20°, smaller than 15°).

Each mirror in the projection objective 2101 can further be characterized by a range of the angles of incidence in the meridional section of the projection objective 2101. The range within which the angle Θ varies on each mirror is referred to as ΔΘ. The range ΔΘ for each mirror is defined as the difference between an angle $\Theta_{(max)}$ and an angler $\Theta_{(min)}$, wherein $\Theta_{(min)}$ stands for the minimum angle of incidence of the image-forming rays that fall on a mirror surface in the meridional section of the Projection objective 2101, and $\Theta_{(max)}$ stands for the maximum angle of the incident image-forming rays on a mirror surface, as has already been defined above. The range ΔΘ generally varies between mirrors in the projection objective 2101 and can be relatively small for some mirrors, for example smaller than 25° (e.g., smaller than 20°, smaller than 15°, smaller than 10°). On the other hand, ΔΘ can be relatively large for other mirrors in the projection objective 2101. For example, ΔΘ can be 20° or larger, in particular 25° or larger (e.g., 30° or larger, 35° or larger, 40° or larger). In some embodiments, the maximum value $\Delta\Theta_{max}$ for all ranges ΔΘ, i.e. the maximum over all mirrors of the projection objective 2101 for the respective range of variation ΔΘ on each mirror can be relatively small, for example smaller than 25° (e.g., smaller than 20°, smaller than 15°, smaller than 12°, smaller than 10°, smaller than 8°).

FIG. 1e shows an example of a mirror 2660 of the type used in the projection objective. The mirror 2660 has the shape of a ring segment, i.e., a segment of a circular mirror 2670 with a diameter D. The mirror 2660 has a maximum dimension $M_x$ in the x-direction. In examples of embodiments, the dimension $M_x$ can be 800 mm or less (e.g., 700 mm or less and, 600 mm or less, 500 mm or less, 400 mm or less, 300 mm or less, 200 mm or less, 100 mm or less).

The mirror 2660 is symmetric relative to the meridional section 2675. The meridional plane is defined by the y- and z-axes of the local coordinate system. The mirror 2660 has a dimension $M_y$ along the meridional line 2675, which can be smaller or larger than $M_x$. In circular mirrors, for example in mirrors that are arranged in an aperture stop plane, the dimensions $M_x$ and $M_y$ are equal, i.e., $M_x=M_y$. In some embodiments, $M_y$ lies in the vicinity of 0.1 $M_x$ (e.g., 0.2 $M_x$ or more and, 0.4 $M_x$ or more, 0.5 $M_x$ or more, 0.6 $M_x$ or more, 0.7 $M_x$ or more, 0.8 $M_x$ or more, 0.9 $M_x$ or more). On the other hand, $M_y$ in certain embodiments can be equal to 1.1 $M_x$ or larger (e.g., 1.5 $M_x$ or larger, in the range from 2 $M_x$ to 10 $M_x$) $M_y$ can be about 800 mm or less (e.g., 700 mm or less, 600 mm or less, 500 mm or less, 400 mm or less, 300 mm or less, 200 mm or less, 100 mm or less).

The mirrors of the projection objective can be arranged so that the optical axis 2105 intersects the mirror, but also in such a way that the optical axis 2105 does not intersect the mirror.

Depending on the design, the projection objective 2100 can generally comprise mirrors of different shapes and sizes. In some example, the maximum dimension D of each mirror of the projection objective can be 1000 mm or less, in particular 900 mm or less (e.g., 800 or less, 700 mm or less).

In general, the shape of the field of the projection objective 2101 can vary. FIG. 1f shows a ring segment 2700, also referred to as a ring field. The ring segment 2700 can be characterized by an x-dimension $D_x$, a y-dimension $D_y$, and a radial dimension $D_r$. $D_x$ and $D_y$ are the dimensions of the field as measured, respectively, in the x-direction and in the y-direction. The amounts for these dimensions will be named in the following description. For example in a field of 26×2 $mm^2$ in the image plane, the dimension $D_x$ is 26 mm and $D_y$ is 2 mm. The dimension $D_r$ represents the ring radius measured from the optical axis 2105 to the inner border of the field 2700. The ring field segment 2700 is symmetric relative to a plane indicated by the line 2710, which is parallel to the y/z-plane. In general, $D_x$, $D_y$ and $D_r$ vary in magnitude, depending on the design of the projection objective 2101. Typically, $D_x$ is larger than $D_y$. The relative sizes of the field dimensions or field measurements $D_x$, $D_y$ and $D_r$ in the object plane 2103 and in the image plane 2102 vary as a function of the magnification or reduction ratio of the projection objective 2101. In some examples, $D_x$ in the image plane 2102 is relatively large, for example larger than 1 mm (e.g., larger than 3 mm and, larger than 4 mm, larger than 5 mm, larger than 6 mm, larger than 7 mm, larger than 8 mm, larger than 9 mm, larger than 10 mm, larger than 11 mm, larger than 12 mm, larger than 13 mm, larger than 14 mm, larger than 15 mm, larger than 18 mm, larger than 20 mm, larger than 25 mm, larger than 30 mm). The dimension $D_y$ in the image plane 2102 can lie in the range from 0.5 mm to 5 mm (e.g., up to 1 mm, up to 2 mm, up to 3 mm, up to 4 mm). Typically, $D_r$ in the image plane 2102 is in the range from 10 mm to 50 mm (e.g., 15 mm or more or, 20 mm or more, 25 mm or more, 30 mm or more).

Generally speaking, for other field shapes such as for example a rectangular field, the projection objective 2101 can have a maximum field dimension or field measurement in the image plane 2102 of more than 1 mm (e.g., more than 3 mm and, more than 4 mm, more than 5 mm, more than 6 mm, more than 7 mm, more than 8 mm, more than 9 mm, more than 10 mm, more than 11 mm, more than 12 mm, more than 13 mm, more than 14 mm, more than 15 mm, more than 18 mm, more than 20 mm, more than 25 mm, more than 30 mm). FIG. 1e further shows the central field point Z. The central field point Z defines the origin of a local x-y-z coordinate system. In scanning microlithography systems, the y-direction generally indicates the scanning direction.

In general, the projection objective 2101 can be optimized and analyzed by using commercially available optical design programs such as ZEMAX, OSLO, Code V. After the wavelength, the field size and the numerical aperture have been defined at the outset, the optical properties can be optimized which are needed in a projection objective, such as for example the wave front aberration, the telecentricity, the uniformity as well as the distortion and the image field curvature. In the following, examples for realizing the disclosure will be described in detail with optical data. All optical data presented herein are given in Code F format.

Figure 1G:
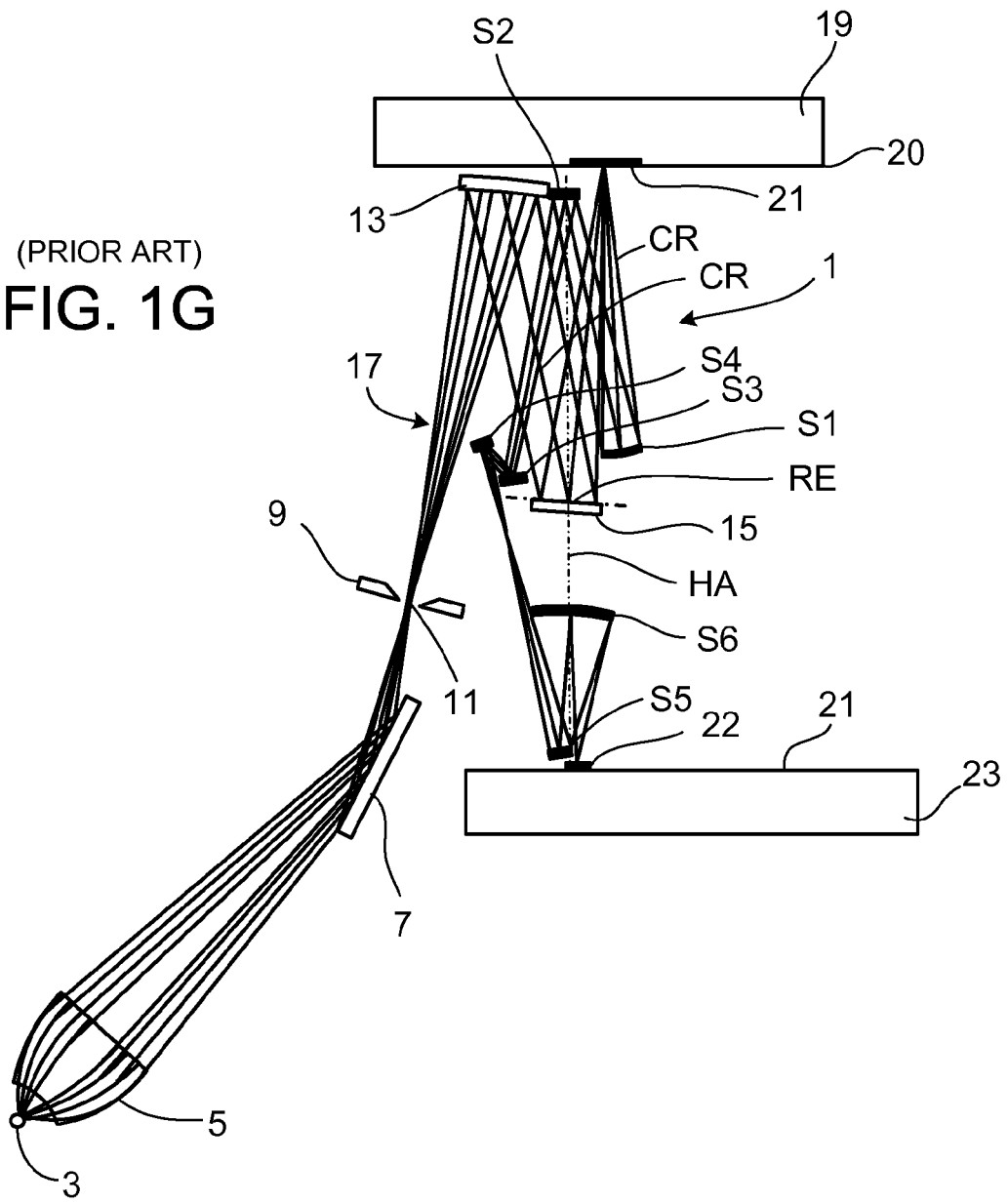

FIG. 1g gives a detailed illustration of a state-of-the-art microlithography projection exposure apparatus as disclosed in Patent Application Publication US 2005/088760. The projection objective 1 has a negative back focus. The illumination system includes a primary light source 3 and a light-collecting optical element, a so-called collector 5. The collector 5 is a grazing-incidence collector. The radiation emitted by the light source is filtered by means of the spectral filter element 7 together with the aperture stop 9, so that behind the aperture stop there is only usable radiation of, e.g., 13.5 nm wavelength. The spectral filter in the form of a grid element diffracts the light that falls on the grid element in different directions, for example in the first-order diffraction. The aperture stop is arranged in or near the intermediate image 11 of the primary light source 3 in the first-order diffraction. The projection exposure apparatus further includes a first facetted optical element 13 with first facets, so-called field raster elements which are configured as small facet mirrors, and a second optical element 15 with second facets, so-called pupil raster elements. The first optical element 13 which comprises the field facets breaks up the incident light bundle 17 which arrives from the primary light source 3 into a multitude of light bundles. Each of the light bundles is focused and forms a secondary light source at or near the place where the second optical element 15 with pupil raster elements is arranged.

If the field raster elements have the shape of the field to be illuminated, as shown in the illustrated examples, it is not necessary to provide a mirror for the shaping of the field.

In the object plane 20 of the microlithography projection exposure apparatus, a reticle is arranged on a transport stage 19. The reticle which is arranged in the object plane 20 is projected by mans of the projection objective 1 onto a light-sensitive substrate 22, for example a wafer, which is likewise arranged on a carrier stage 23. The projection objective shown here comprises six mirrors, i.e. a first mirror S1, a second mirror S2, a third mirror S3, a fourth mirror S4, a fifth mirror S5, and a sixth mirror S6, in an arrangement that is centered in relation to a common optical axis HA. The projection objective 1 has a negative back focus of the entry pupil. The second facetted optical element 15 of the illumination system is arranged in or near the plane of the associated mirrored entry pupil RE.

As can be seen clearly in FIG. 1g, with the configuration of the state-of-the-art projection objective, the light-ray path crosses over itself between the illumination system and the projection objective, and consequently this system is not amenable to a modular configuration which would allow a separation of the illumination system from the projection objective.

Figure 1H:
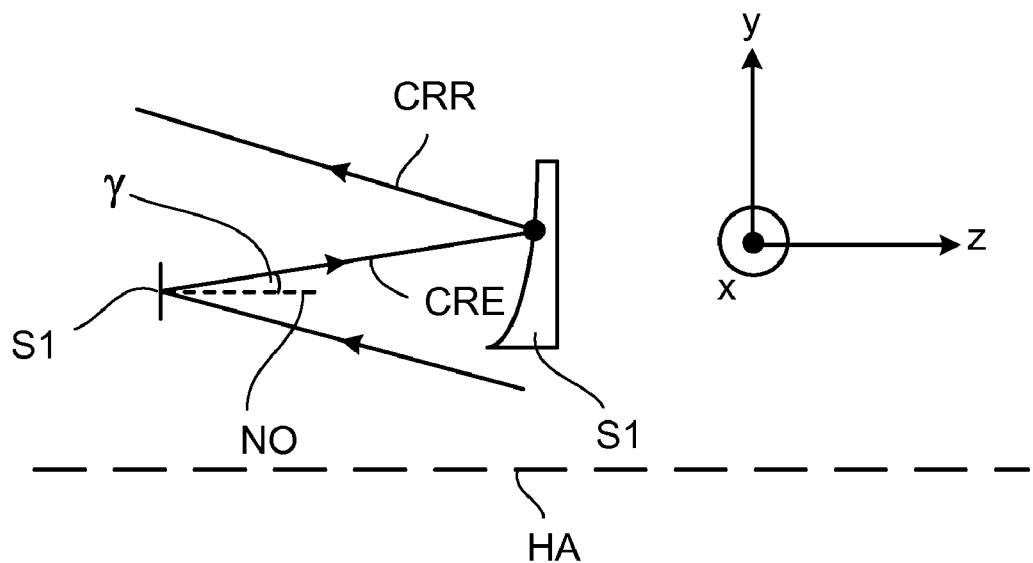

FIG. 1h represents the ray path for many of the embodiments of projection objectives that are presented herein, which have a negative back focus in the area of the object plane 51 of the projection objective and of the mirror S1 that comes first in the light path from the object plane to the image plane, with the latter not being shown in FIG. 1h. The symbol CRE in FIG. 1h identifies the incident principal ray falling on the first mirror, and CRR represents the reflected principal ray belonging to one and the same field point, for example the central field point, of the object field. As can be seen in FIG. 1h, in some embodiments of the disclosure the principal ray CRE of the incident light bundle in the meridional plane of the projection objective lies between the principle ray of the light bundle CRR that is reflected from the surface of the mirror S1 and the optical axis HA of the projection objective.

Also shown in FIG. 1h is the local x-y-z coordinate system, the normal direction NO that is perpendicular to the object plane 51 in which an object field is formed, and the positive principal ray angle γ under which the principal ray CRE is reflected by an object (not shown) in the object plane 51.

Figure 2A:
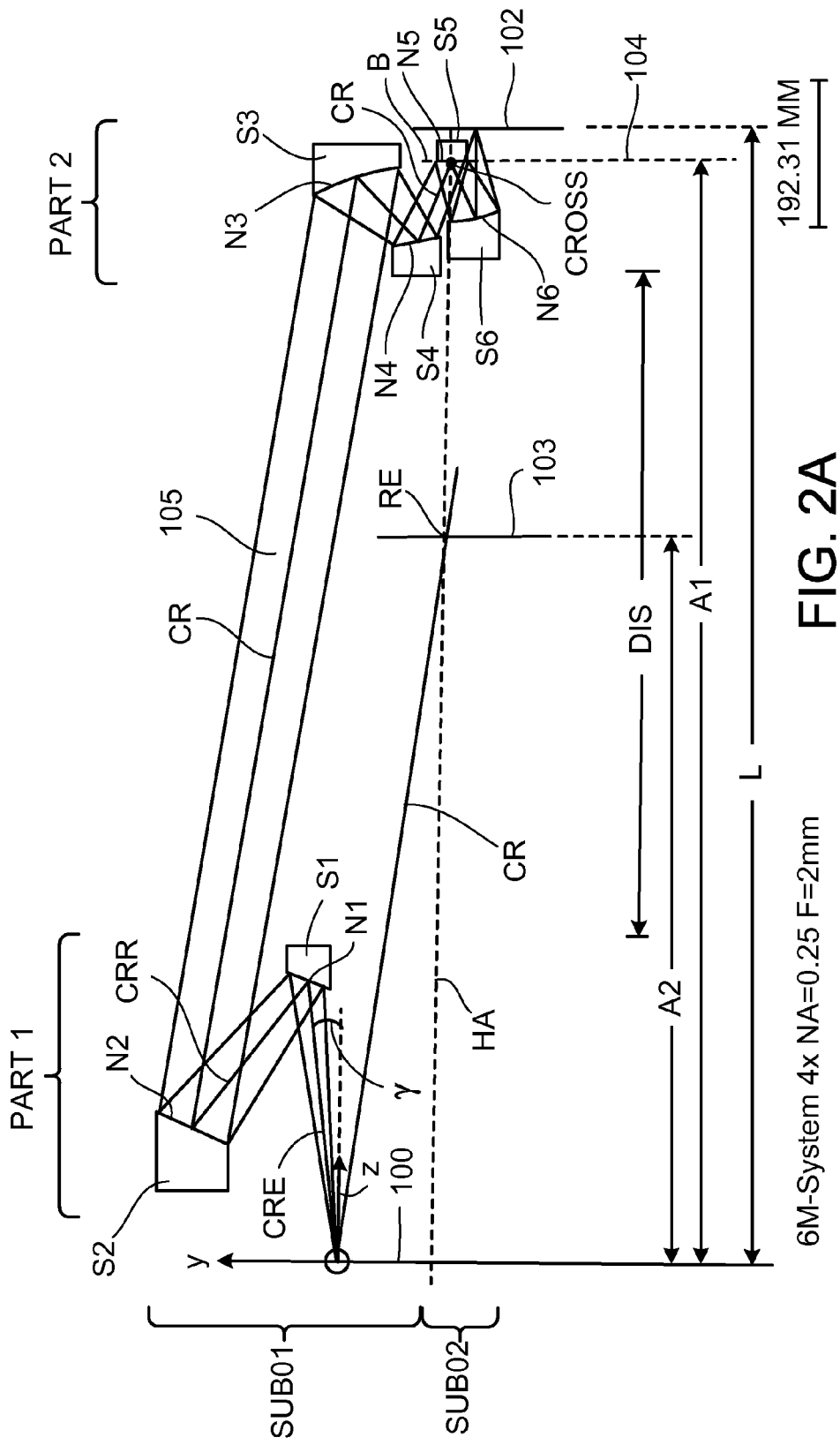
FIG. 2a represents a first example that embodies a projection objective according to the disclosure with a negative back focus of the entry pupil, wherein no intermediate image is formed in the light path from the object plane to the image plane, FIG. 2b consists of Table 1.

FIG. 2a illustrates a first embodiment of a six-mirror projection objective which has a negative back focus of the entry pupil, but which is amenable to a modular design configuration of a microlithography projection exposure apparatus. The objective according to FIG. 2a has an object plane 100, an image plane 102, a first mirror S1, a second mirror S2, a third mirror S3, a fourth mirror S4, a fifth mirror S5, and a sixth mirror S6.

As can be clearly seen, no intermediate image is formed in the light path from the object plane 100 to the image plane 102 in the projection objective shown in FIG. 2a. The objective has only a single aperture stop plane 104 which in the illustrated example is located on the fifth mirror, i.e. in the posterior part of the objective which consists of the fifth mirror S5 and the sight mirror S6. By arranging the aperture stop plane 104 in this way, it becomes possible to arrange the mirrors S1 and S2 in the anterior part of the objective at a large distance from the optical axis HA. If a projection objective of this kind is used in a projection exposure apparatus with a reflective object in an object plane, the arrangement where the mirrors in the anterior part of the objective have a large distance from the optical axis makes it possible to place components of the illumination system, specifically a facetted optical element of the illumination system, in this space on the optical axis of the projection system and thus in or near the mirrored entry pupil RE. The projection objective illustrated in FIG. 2a has an image-side numerical aperture of NA=0.25 and a reduction ratio of 4. The field size of the field that is projected into the image plane is 2×26 mm², which means that the dimension $D_y$ of the field measured along the y-axis (see FIG. 1e) is 2 mm, and the dimension $D_x$ is 26 mm. In the example shown in FIG. 2, the principal ray CRE of the incident ray bundle falling on the mirror surface of the first mirror S1 lies on the meridional plane between the reflected principal ray CRR associated with the same field point of the reflected ray bundle and the optical axis HA of the projection objective. Further shown is the mirrored entry pupil RE of the projection objective, which lies in the plane 103. The point of intersection with the optical axis of the principal ray CR of the light beam 105 propagating from the object plane to the image plane is identified by the label "CROSS". According to the disclosure, this point of intersection labeled CROSS lies in the posterior part of the objective in the meridional section between the plane 103 in which the mirrored entry pupil RE lies and the plane that contains the point of intersection CROSS. The projection objective in the figuration of FIG. 2a has a resolution of 22 nm, an image-side wave front aberration RMS of 0.008λ, an image-side field curvature of 7 nm and a distortion of 2.5 nm. The objective has no intermediate image, and it possesses an accessible aperture stop plane 104. As described above, the aperture stop B is formed in the accessible aperture stop plane 1043 which is also at the same time a pupil plane and which includes the point of intersection CROSS—on the fifth mirror. FIG. 2a further shows the distance A1 of the plane 104 containing the point of intersection CROSS from the object plane 100 along the optical axis HA as well as the distance A2 of the plane 103 containing the mirrored entry pupil RE from the object plane 100. The two distances conform to the rule A2<A1. Also shown in FIG. 2a are a first sub-objective (SUBO1) and a second sub-objective (SUBO2), where the second sub-objective (SUOBO2) includes the aperture stop B.

It can further be seen in FIG. 2a that the projection objective is subdivided into two partial systems, i.e. a first partial system PART1 and a second partial system PART2. The first partial system PART1 with the mirrors S1 and S2 has a distance DIS along the optical axis HA from the second partial system PART2 with the mirrors S3, S4, S5 and S6.

The distance DIS is defined as the distance between the back surface of the mirror in the first partial system PART1 with the largest distance from the object plane 100 and the back surface of the mirror in the second partial system PART2 with the largest distance from the image plane 102. In the present case, it is the distance between the back surface of the first mirror S1 and the back surface of the fourth mirror S4.

The distance between the object plane 100 and the image plane 102 is 1500 mm, the maximum mirror diameter, i.e. the maximum dimension $M_y$ of all mirrors as measured in the meridional section is 131 mm, and the maximum mirror diameter of all mirrors as measured in the x-direction, i.e., the maximum dimension $M_x$, is 370 mm.

In the sequence from the first mirror S1 to the second mirror S2, the third mirror S3, the fourth mirror S4, the fifth mirror S5, and the sixth mirror S6, the respective mirror curvatures are N-P-P-N-N-P, which means convex-concave-concave-convex-convex-concave.

Figure 3A:
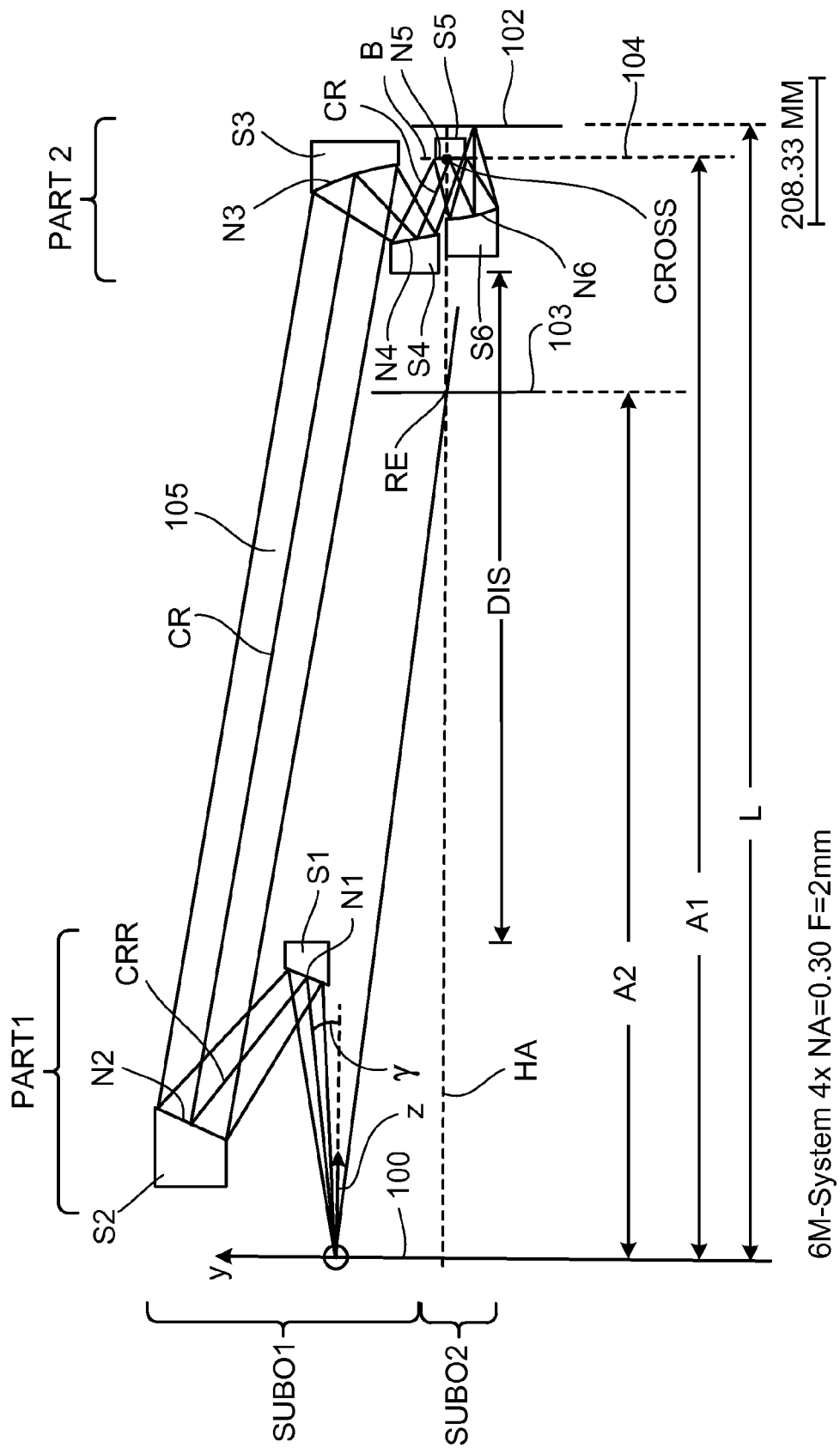
FIG. 3a shows an alternative version of a projection objective according to the first embodiment, FIG. 3b consists of Table 2.

The principal ray angle γ in the first embodiment, i.e. the angle of the principal ray CR associated with the central field point of the field in the object plane 100 is γ=7° in relation to the surface-normal direction. The distance of the central field point from the optical axis is 132 mm. Based on these data, it can be calculated that the mirrored entry pupil RE has a maximum distance of 1075 mm from the object plane. The optical data of the embodiment shown in FIG. 2a are listed in Code V format in Table 1 which is attached as FIG. 2b. The nomenclature of tables in Code V format are well understood by a man skilled in the art. In the Code V tables for reflective systems thickness mean in the context of mirror systems the thickness of the air space between two neighboring optical surfaces, i.e., the distance along the optical axis between two optical surfaces that directly follow each other in the light path FIG. 3a illustrates a second embodiment of a six-mirror projection objective according to the disclosure without intermediate image and with negative back focus of the entry pupil. This embodiment has an image-side numerical aperture NA of 0.30 and a field size $D_y \times D_x$ of 2×26 mm² as well as a reduction ratio of 4×. The image-side wave front aberration is 0.03λ, the image-side field curvature 18 nm, and the distortion is 4 nm. In the sequence of mirrors from the object plane to the image plane the mirror curvatures follow each other as N-P-P-N-N-P, i.e. convex-concave-concave-convex-convex-concave. The projection objective includes an accessible aperture stop 104. The aperture stop B is arranged in the accessible aperture stop plane 104 on the fifth mirror. The aperture stop plane is at the same time also a pupil plane which contains the point of intersection CROSS of the principal ray CR with the optical axis HA. The distance from the object plane 100 to the image plane 102 is 1600 mm, the maximum dimension $M_y$ in the meridional section for all mirrors is 176 mm, and the maximum mirror diameter, i.e. the maximum dimension $M_x$ measured in the x-direction for all mirrors is 459 mm.

The principal ray angle at the central field point is γ=7° at the object, and the distance of the central field point from the optical axis is 159 mm. The mirrored entry pupil RE in the plane 103 has an axial distance A2 of 1295 mm from the object plane 100. Components that are analogous to those in FIG. 2a have the same reference symbols. As in FIG. 2a, the principal ray CRE of the incident ray bundle falling on the surface of the first mirror S1 lies in the meridional section between the optical axis and the principal ray CRR of the ray bundle associated with the same field point that is reflected from the surface of the first mirror. The point of intersection CROSS of the principal ray CR of the central field point with the optical axis HA of the projection objective is geometrically located between the plane 103 with the mirrored entry pupil RE of the projection objective and the image plane 102. The distance along the optical axis between the plane 104 which contains the point of intersection CROSS and the object plane is labeled with A1, and the distance along the optical axis between the plane 103 which contains the mirrored entry pupil and the object plane is labeled with A2. In the present embodiment, A2 is smaller than A1, due to the location of the point of intersection CROSS between the mirrored entry pupil RE and the image plane.

As can be seen in FIG. 3a, the principal ray has on its light path from the object plane 100 to the image plane 102 exactly one point of intersection CROSS with the optical axis. Therefore, according to the disclosure, all points of intersection of the projection objective lie between the plane 103 of the mirrored entry pupil RE and the image plane 102.

The second embodiment likewise comprises two partial systems, i.e. a first partial system PART1 and a second partial system PART2, at a distance DIS from each other.

The system data in Code V format for the second embodiment according to FIG. 3a are listed in Table 2 in FIG. 3b.

Figure 4:
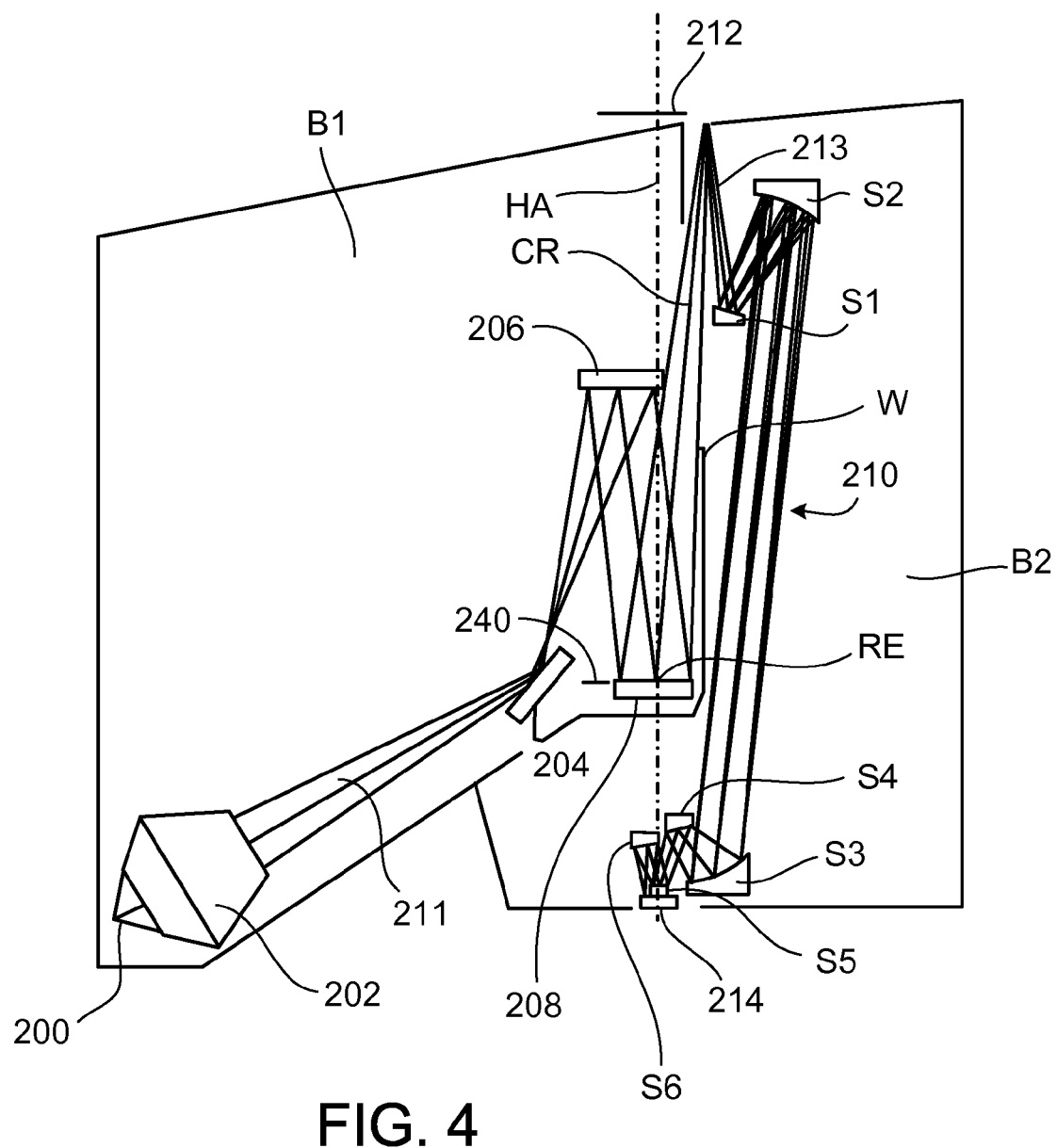
FIG. 4 shows a microlithography projection exposure apparatus that contains a projection objective according to FIG. 2a, FIG. 5a shows a second embodiment of a projection objective with negative back focus of the entry pupil, wherein the paths of the light ray cross over themselves in the meridional plane in the first partial objective, FIG. 5b consists of Table 3.

FIG. 4 shows a microlithography projection exposure apparatus with a projection objective according to the embodiment of FIG. 2a and FIG. 2b. As can be seen in FIG. 4, there is no cross-over between the ray pattern of the projection system and the ray pattern of the illumination system, which stands in contrast to the system of FIG. 1g. In other words, the illumination ray bundle 211 on its light path from the next-to-last optical component 206 to the object plane 212 where the object such as a reticle is arranged does not cross over the image-producing ray pattern 213 which proceeds in the projection objective from the object plane 212 to the image plane 214, except for the necessary cross-over which occurs at the reticle. The meridional plane in the present case is the plane of the drawing, which includes the optical axis HA. The optical elements of both parts of a projection exposure apparatus, i.e. the illumination system and the projection system, are arranged in separate design envelopes. The optical elements of the illumination system are arranged in a first design space B1, while the optical elements of the projection system are arranged in a second design space B2. The first design space B1 is separated for example by a wall W from the second design space B2. Due to the separation between two different design spaces B1 and B2, one obtains a modular design structure for the projection exposure apparatus. As can further be seen, there is enough space available for example for the installation of the pupil facet mirror 208 of a double-facetted illumination system.

The projection exposure apparatus shown in FIG. 4 which operates at wavelengths larger than 100 nm is an example of a projection exposure apparatus in particular for EUV lithography with an image-side numerical aperture of NA≧0.25 (e.g., NA>0.26) and with fewer than 10 optical elements that have a normal-incidence reflection, wherein a cross-over of rays between the respective ray pattern of the illumination system and the projection system is avoided.

The illumination of the microlithography projection exposure apparatus shown in FIG. 4 includes a light source 200, a nested grazing-incidence collector 202, as well as a spectral grid filter 204. The spectral grid filter is identified by the reference symbol 204; the aperture stop that follows the spectral grid filter is not shown in the present example. The spectral grid filter is followed in the ray path by the two facetted optical elements of the double-facetted illumination system. The first facetted optical element, which comprises a multitude of first raster elements, so-called field facets, is identified by the reference symbol 206, and the second facetted optical element, the so-called pupil facet mirror, is identified by the reference symbol 208. The second facetted optical element 208 is arranged in the plane of the mirrored entry pupil RE of the projection objective. Due to the negative back focus of the entry pupil of the projection objective 210, the mirrored entry pupil RE lies to the image side of the object plane 212 in which for example the reflective reticle is arranged. The object plane is identified as 212, the image plane as 214, the optical axis as HA, the first mirror as S1, the second mirror as S2, the third mirror as S3, the fourth mirror as S4, the fifth mirror as S5, and the sixth mirror as S6.

In the following embodiments of microlithography projection objectives with negative back focus of the entry pupil according to FIGS. 5a and 5b and FIGS. 6a and 6b, a free space is created in the microlithography projection exposure apparatus in the area of the mirrored entry pupil RE through a design concept that provides for a cross-over of ray bundles in the anterior part of the objective. The anterior part of the objective is that part of the projection objective which comprises the mirrors which are arranged nearest to the object plane. With this kind of a design it is possible to arrange in particular the second mirror S2 of the six-mirror objective shown in the examples of FIG. 5a and 6a at a large distance from the optical axis HA of the projection objective. The cross-over of rays in the meridional plane which contains the optical axis HA of the projection objective occurs in the illustrated examples of FIG. 5a, 5b and 6a, 6b between the ray bundle which proceeds from the object plane 300 to the first mirror S1 and the ray bundle which proceeds from the second mirror S2 to the third mirror S3. The aperture stop B is arranged in the ray path from the second mirror S2 to the third mirror S3. Due to the large distance of the mirrors in the anterior part of the objective from the optical axis, it is possible to design a microlithography projection exposure apparatus in which the ray pattern of the illumination system does not cross over the ray pattern of the projection objective in the meridional plane, so that a separation is possible between the illumination system and the projection objective, as is the case for example in the system in FIG. 4.

In the example shown in FIG. 5a of a six-mirror projection objective with cross-over of the ray bundles in the anterior part of the objective, an intermediate image ZW is formed between the fourth mirror S4 and the fifth mirror S5. The first mirror is labeled as S1, the second mirror as S2, the third mirror as S3, and the sixth mirror in the light path from the object plane 300 to the image plane 302 is labeled as S6. As was already the case in FIGS. 2a and 3a, FIG. 5a shows only the usable portion of each mirror, with the usable portion of the first mirror S1 labeled N1, the usable portion of the second mirror S2 labeled N2, the usable portion of the third mirror S3 labeled N3, the usable portion of the fourth mirror S4 labeled N4, the usable portion of the fifth mirror S5 labeled N5, and the usable portion of the sixth mirror S6 labeled N6. The usable portion of a mirror is the area that meets the rays of the light bundle which travel from the object plane to the image plane. The embodiment according to FIG. 5 has an image-side numerical aperture of NA=0.25, a reduction ratio of 4×, and a field size of 2×26 mm² of the field in the object plane, i.e. $D_y$=2 mm and $D_x$=26 mm. The principal ray angle of the central field point is γ=7° at the object and the distance of the central field point from the optical axis is 93 mm. As can be calculated from these data, the mirrored entry pupil RE has an axial distance of 757 from the object plane. The resolution is 22 nm, the image-side wave-front aberration RMS is 0.006λ, the image-side field curvature is 1.5 nm, and the distortion is 6 nm. The mirrors follow each other in the sequence P-P-N-P-N-P, i.e. concave-concave-convex-concave-convex-concave. Two planes that are conjugate to the entry pupil, so-called pupil planes 312, 314, are formed in the system. The pupil plane 312 contains the point of intersection CROSS1 of the principal ray CR with the optical axis, while the pupil plane 314 contains the point of intersection CROSS2. The projection objective is telecentric on the image side, so that the exit pupil lies at infinity. The system is distinguished by the fact that the exit pupil is not obscured. The term "exit pupil" means the image of the aperture stop produced by the partial objective that follows the aperture stop. An accessible aperture stop B is arranged in one of the two pupil planes 312, 314 which is accessible from at least one side of the projection objective. The aperture stop B in the present example is formed between the second and third mirrors. The maximum mirror diameter, i.e. the maximum dimension $M_y$ of all mirrors as measured in the meridional section is 157 mm, and the maximum mirror diameter of all mirrors as measured in the x-direction, i.e., the maximum dimension $M_x$, is 389 mm. The maximum angle $\Delta\Theta_{CR(max)}$ of the principal ray of the central field point for all mirrors is 16.4°, the maximum angle of incidence $\Theta_{max(max)}$ on all mirrors in the meridional section is 21°. The maximum bandwidth $\Delta\Theta_{max}$ of the angles of incidence in the meridional section on each mirror is 17.3° for all mirrors.

The distance between the object plane and the image plane is 1550 mm.

The optical data of the example of FIG. 5a are listed in Code V format in Table 3 which is found in FIG. 5b.

Figure 6A:
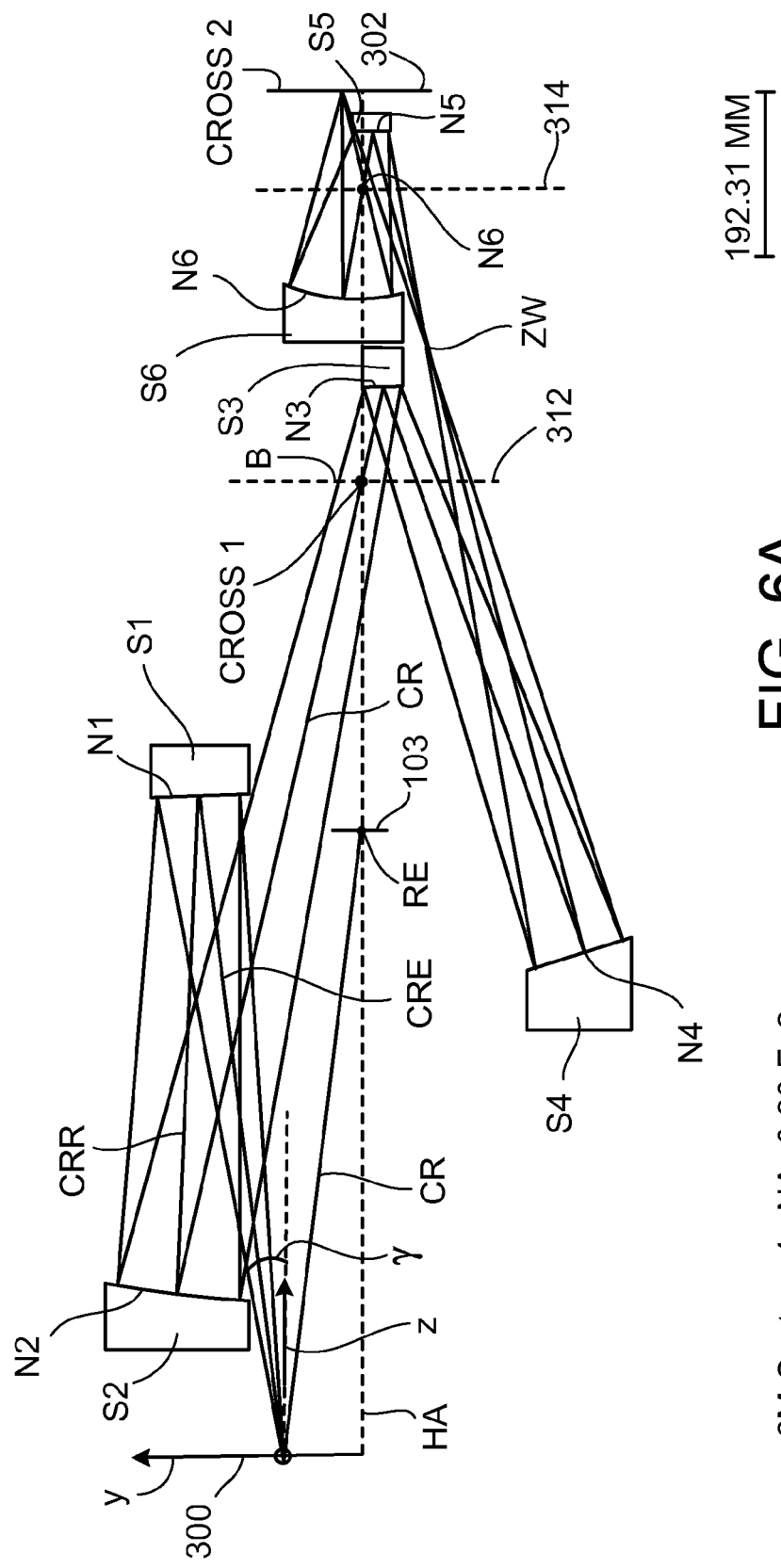
FIG. 6a represents a first alternative system of a projection objective according to the second embodiment, FIG. 6b consists of Table 4.

FIG. 6a illustrates a further embodiment of a six-mirror projection objective according to the disclosure with an intermediate image and with negative back focus of the entry pupil. This embodiment has an image-side numerical aperture NA of 0.30, a reduction ratio of 4×, and a field size of 2×26 mm², i.e. $D_y$=2 mm and $D_x$=26 mm. The principal ray angle at the central field point is γ=7° at the object, and the distance of the central field point from the optical axis is 106 mm. The distance between the object plane 300 and the image plane 302 is 1520 mm. The mirrored entry pupil RE has an axial distance of 754 mm from the object plane. The system has a resolution of 18 nm, an image-side wave front aberration RMS of 0.018λ, an image-side field curvature of 11 nm, and a distortion of 3.2 nm. The six mirrors follow each other from the object plane to the image plane in the sequence P-P-N-P-N-P, i.e. concave-concave-convex-concave-convex-concave. Two pupil planes are formed in the light path from the object plane to the image plane, with one of the pupil planes being accessible. The aperture stop B is arranged in the accessible pupil plane. The aperture stop plane B is formed between the second and the third mirror. The maximum mirror diameter, i.e. the maximum dimension $M_y$ of all mirrors as measured in the meridional section is 189 mm, and the maximum mirror diameter of all mirrors as measured in the x-direction, i.e., the maximum dimension $M_x$, is 423 mm. The maximum angle of incidence $\Delta\Theta_{CR(max)}$ of the principal ray of the central field point for all mirrors is 19°, the maximum angle $\Theta_{max(max)}$ for all mirrors in the meridional section is 24.1°, and the maximum range $\Delta\Theta_{max}$ of the angles of incidence for all mirrors is 19.8°. Components that are analogous to those in FIG. 5a are identified by the same reference numerals. Common to both of the systems of FIG. 5a and FIG. 6a is the spatial arrangement of the mirrors in the anterior part of the objective along the optical axis, namely:

second mirror S2-fourth mirror S4-first mirror S1-third mirror S3.

Furthermore common to both of the systems of FIG. 5a and FIG. 6a, the aperture stop B is arranged between the second mirror S2 and the third mirror S3 in or near the pupil plane 312.

The optical data of the embodiment according to FIG. 6a are listed in Code V format in Table 4 which is presented in FIG. 6b.

The embodiment of FIG. 6c represents an alternative to the systems according to FIGS. 5a and 6a. The aperture stop B in the embodiment of FIG. 6c is located directly on the third mirror S3 in the pupil plane 312. Placing the aperture stop on a mirror has the advantage that the passing ray bundles are not separated as strongly from each other, so that either the angles of incidence can be made smaller or, if the angles of incidence are kept the same, the overall length can be made shorter, as is the case in this example. The system according to FIG. 6c has the further advantage that the angles of incidence are small on all mirrors. The spatial arrangement of the mirrors in the anterior part of the objective is as follows:

fourth mirror S4-second mirror S2-first mirror S1-third mirror S3.

Compared to the embodiment of FIG. 6a, the positions of the mirrors S2 and S4 along the optical axis have been switched.

FIG. 6a shows a lens section of the foregoing system. The optical data for this system are listed in Code V format in Table 5 which is shown in FIG. 6d. The image-side numerical aperture of the system is NA=0.25, and the field size is 2×26 mm², wherein the field is configured as a ring field segment.

The reduction ratio of the system of FIG. 6c is 4×, the image resolution is 22 nm, the RMS value for the image-side wavefront aberration is 0.019λ, the image-side field curvature is 20 nm, and the distortion is 0.8 nm. There are six mirrors in total following each other in the sequence PPNPNP, i.e. concave-concave-convex-concave-convex-concave. Overall, the system has two pupil planes 312, 314, one of which is accessible. The accessible pupil plane is at the same time the plane in which the aperture stop B is arranged. The aperture stop B is arranged on the third mirror. The distance between the object plane 100 and the image plane 102 is 1490 mm, the maximum mirror diameter, i.e. the maximum dimension $M_y$ of all mirrors as measured in the meridional section is 197 mm, and the maximum mirror diameter of all mirrors as measured in the x-direction, i.e., the maximum dimension $M_x$, is 464 mm, and the maximum angle of incidence $\Delta\Theta_{CR(max)}$ of the principal ray of the central field point for all mirrors is 16.6°, the maximum angle $\Theta_{max(max)}$ for all mirrors in the meridional section is 19.2°, and the maximum range $\Delta\Theta_{max}$ of the angles of incidence in the meridional section for all mirrors is 16.7°.

The following FIGS. 7 to 13 show advantageous embodiments of microlithography projection exposure apparatus which are compatible with the use of projection objectives with negative back focus of the entry pupil as disclosed herein, or as also described in US 2005/0088760.

In the illumination systems of the known state of the art, the projection objectives mostly have a positive back focus of the entry pupil. In projection systems that have projection objectives with a positive back focus, the optical elements such as for example a holographic diffuser or also a second facetted optical component of an illumination system which is configured as a double-facetted system cannot be placed in the entry pupil of the projection objective, but are projected as images by means of optical elements into an entry pupil that is located after the object plane in the light path from a light source to an image plane.

In a projection objective with a negative back focus of the entry pupil, the mirrored entry pupil is located to the image side of the object plane in which for example the reflective reticle is arranged. In these systems, an optical integrator such as for example a diffuser, or also the pupil facet mirror in a double-facetted illumination system, can be arranged in or near the mirrored entry pupil RE.

Figure 7:
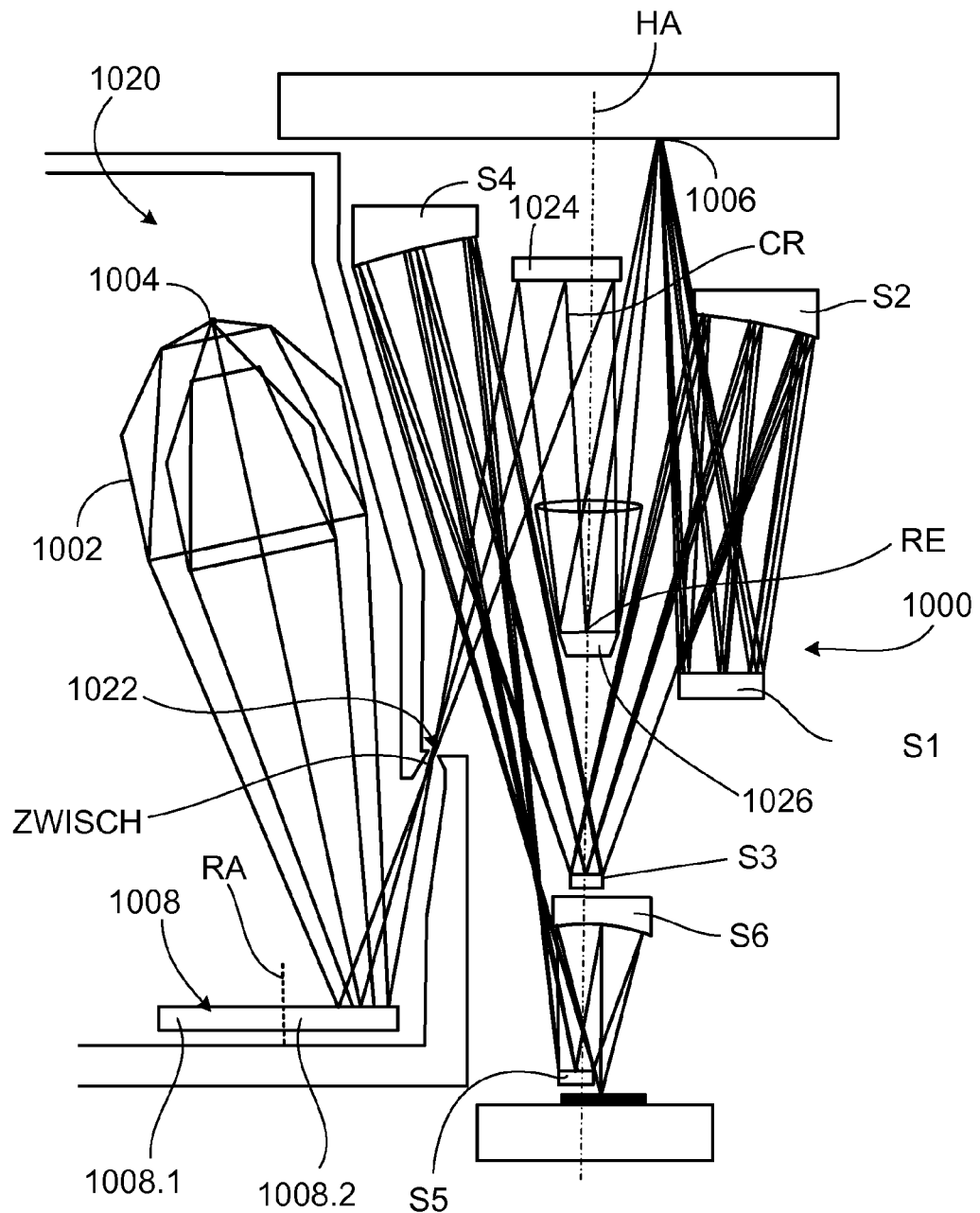
FIG. 7 represents a first embodiment of a microlithography projection exposure apparatus with a projection objective with negative back focus, a normal-incidence mirror that serves as a narrow-band wavelength filter, as well as a first and a second facetted optical element.

A first embodiment of a system of this type is shown in FIG. 7. The system according to FIG. 7 includes a projection objective 1000 with negative back focus which has a first mirror S1, a second mirror S2, a third mirror S3, a fourth mirror S4, a fifth mirror S5, and a sixth mirror S6. Furthermore, the illumination system includes a nested grazing-incidence collector 1002 which is located in the light path downstream of the light source and receives the radiation of the light source 1004 in a half-space with a large aperture of NA≧0.7. The illustrated collector in the schematic sketch has only two mirror shells which are rotationally symmetric relative to an axis of rotation, wherein two reflections occur at each of the shells. Of course, a collector with more than two shells and with more than two reflections per shell would likewise be conceivable. In the embodiment shown in FIG. 7, a normal-incidence mirror 1008 is arranged in the light path from the light source 1004 to the object plane 1006. Due to its multi-layered coatings, for example 40 to 70 Mo/Si coatings, the normal-incidence mirror 1008 functions as a narrow-band wavelength filter. The concept of using a normal-incidence mirror which due to its multi-layered coating acts as a narrow-band wavelength filter belongs to the known state of the art. A mirror of this type can be moved into different positions, so that different usable areas 1008.1 and 1008.2 can be positioned in the ray path. In the present example, the move to a different location occurs by turning about the axis of rotation RA. The area of the multi-layered mirror 1008 that is moved out of the ray path can now be cleaned, for example with a cleaning device. In addition, a spectral grid filter can be put on the currently operative usable range 1008.1, 1008.2 of the normal-incidence multi-layered mirror 1008. The way in which the state-of-the-art spectral filter removes light that is not of the usable wavelength is that the light of the light source falls on a grid which has at least one grid period in a grid plane that is significantly larger than the usable wavelength (e.g., 150 to 200 times larger than the usable wavelength). If the usable wavelength is for example around 13.5 nm, the periodicity of a binary grid acting in this manner as a spectral filter is of the order of microns.

In the light path from the light source to the first facetted element, a first intermediate image IMI is formed in the illumination ray path in the illustrated embodiment. The optical components which are located in the illumination ray path before the intermediate image IMI, i.e. the light source 1004, the collector 1002, as well as the normal-incidence mirror 1008 are combined in a first space 1020. This first space 1020 is separated from the rest of the components by a screen with only a single opening 1022, which is substantially where the intermediate image IMI is located. The first facetted optical component includes a mirror, the so-called field facet mirror 1024 with a large number of field facets which in the present example have the same shape as the field to be illuminated in the object plane. The field facets are therefore configured with an arcuate shape. As an option for adjusting the setting of the illumination, the field facet mirror 1042 can be exchanged for another field facet mirror. One possibility for the way in which one facet mirror can be exchanged for another consists for example in putting field facet mirrors with different facet arrangements on a component that is capable of swiveling about an axis.

The field facet mirror 1024 disassembles the incident light bundle into a large number of light bundles which are associated with the individual field facets. Each light bundle associated with a field facet forms a secondary light source. Arranged at or near the location of the secondary light source is the second facetted optical element, either in or close to the plane in which the mirrored entry pupil RE of the projection objective is located. The second facetted optical element is also referred to as pupil facet mirror 1026, and the raster elements arranged on it are referred to as pupil facets. Like the field facet mirror, the pupil facet mirror 1026 also comprises 200 to 300 facetted elements, in this case pupil facets. The individual pupil facets can be configured to be switchable to allow an adjustment of the setting. In the area that is not being used, the pupil facet mirror can have cutouts, so that the path of light propagation is not impeded in the projection objective. In order to suppress scattered light and keep it from entering the projection objective, there is a screen 1030 arranged above the facet mirror. As an alternative to a setting adjustment by means of a change in the channel assignment, it is also possible to set an aperture stop in place before the pupil facet mirror, which is however not illustrated in the present embodiment.

Figure 8:
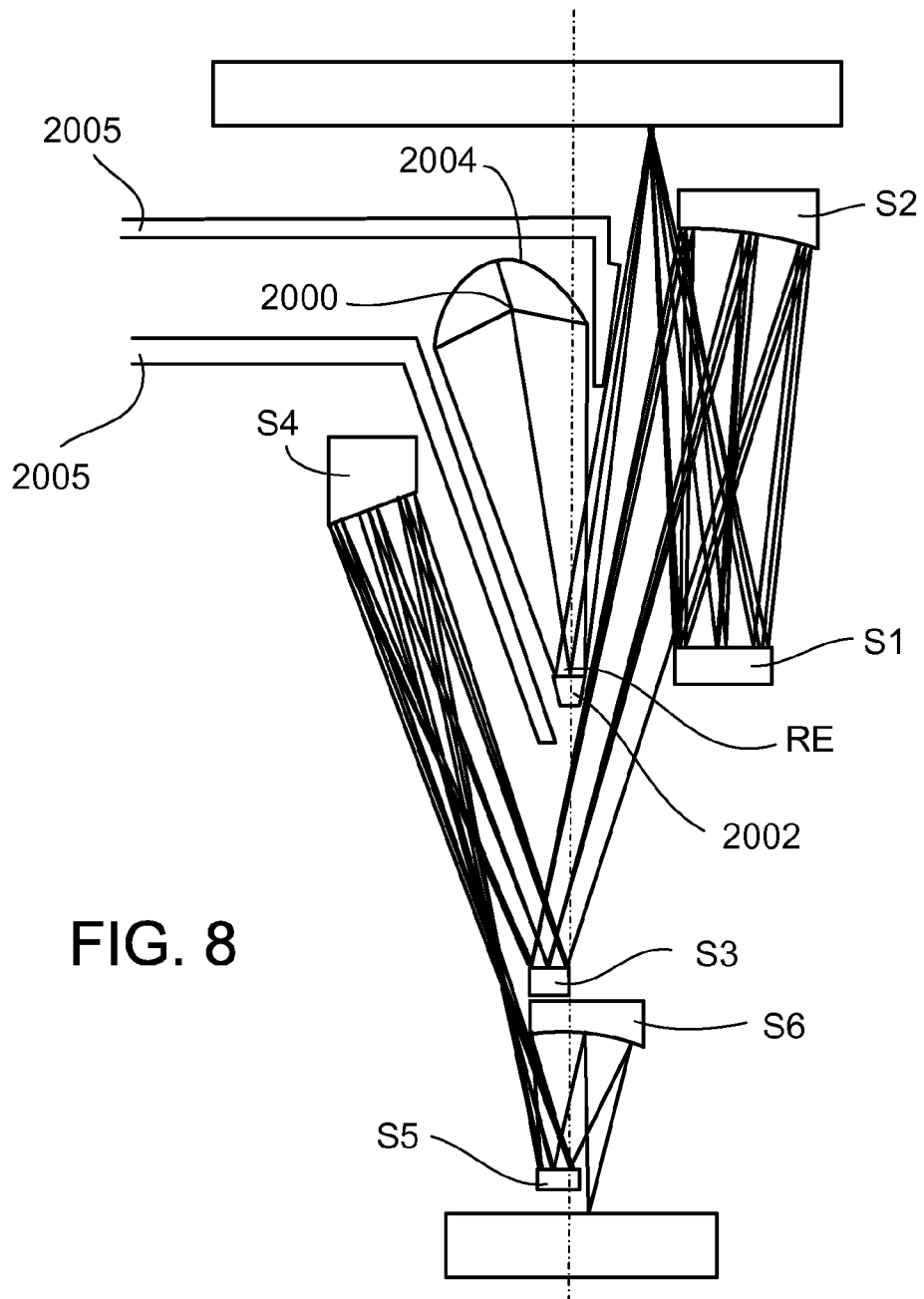
FIG. 8 represents a microlithography projection exposure apparatus with a diffuser that is arranged in the pupil plane or in the light path after the pupil plane.

FIG. 8 shows an alternative configuration of an illumination system in which the optical integrator is configured as a diffuser. The light source in FIG. 8 is labeled with the reference numeral 2000. The light source 2000 is in this case a laser-plasma source with a horizontal pump jet. In order to collect the part of the radiation that is emitted to the rear of the radiation source, the arrangement includes a normal-incidence mirror 2004 which can be configured as a rotational ellipsoid. A possible alternative is to collect the light with more than one collector, for example by using a dual collector. A dual collector system is a normal-incidence collector system with two obliquely positioned normal-incidence collector mirrors. A spectral grid filter can be incorporated on the ellipsoid of the collector.

As a rule, the diffuser 2002 is configured as a diffuser mirror with 500 to 1000 small mirror facets or, alternatively, as a holographic lattice grid.

As shown in FIG. 8, the illumination system is of a very compact design and consists merely of the light source 2000, the collector 2004, and the diffuser 2002. In order to insulate the illumination system from the projection objective with negative back focus of the entry pupil, there are screens set up in the microlithography projection apparatus, optionally in the form of protective shields that can be cooled. The screen is labeled 2005. The projection objective is a six-mirror projection objective with a first mirror S1, a second mirror S2, a third mirror S3, a fourth mirror S4, a fifth mirror S5, and a sixth mirror S6. The diffuser 2002 in the form of an optical integrator in the system shown in FIG. 8 is again arranged in or near the mirrored entry pupil RE of the projection objective. Due to the limited designs space and due to the angles of propagation, a setting of σ>1 is not possible in the systems according to FIGS. 7 and 8.

The system of FIG. 8 has only 8 mirrors in the light path from the light source to the image plane of the projection objective where the object to be illuminated is arranged, for example a wafer. However, the reflective reticle in the object plane was not counted in the number of mirrors for the system according to FIG. 8. As an alternative possibility in the system according to FIG. 8, the collector 2004 can be replaced by another collector, for example a grazing-incidence collector. Even with a system of this kind with a grazing-incidence collector, it is possible to specify an EUV projection exposure apparatus with nine or fewer mirrors in which an image-side numerical aperture of NA≧0.25 (e.g., NA≧0.3) is possible with a field size of 2×26 mm$^2$.

In order to make a setting with σ>1 possible, it is advantageous to fold the light path in the illumination system, for example by means of a planar mirror. This is demonstrated in the system in FIG. 9. Components that are analogous to those in the preceding example are labeled with the same reference numerals. With the mirror 2008 the light path before the second optical element 2007 with second raster elements (not shown) is folded towards the reticle that is arranged in the object plane 2009 and thus allows the first optical element 2006 with first raster elements, i.e. the field facet mirror, to be located in an easily accessible space. The field facet mirror can be arranged on a support 2010 that includes different field facet mirrors and can be swiveled about an axis of rotation R1. The rotatable support can serve to exchange facet mirrors of equal configuration in order to clean the exchanged mirror in case of contamination. As another possibility, the support element for the facet mirror can also carry different facet mirrors, i.e. facet mirrors with different arrangements of raster elements, so that different illumination settings can be realized by a rotation about the axis R1. Combinations of these concepts are also possible.

Figure 9:
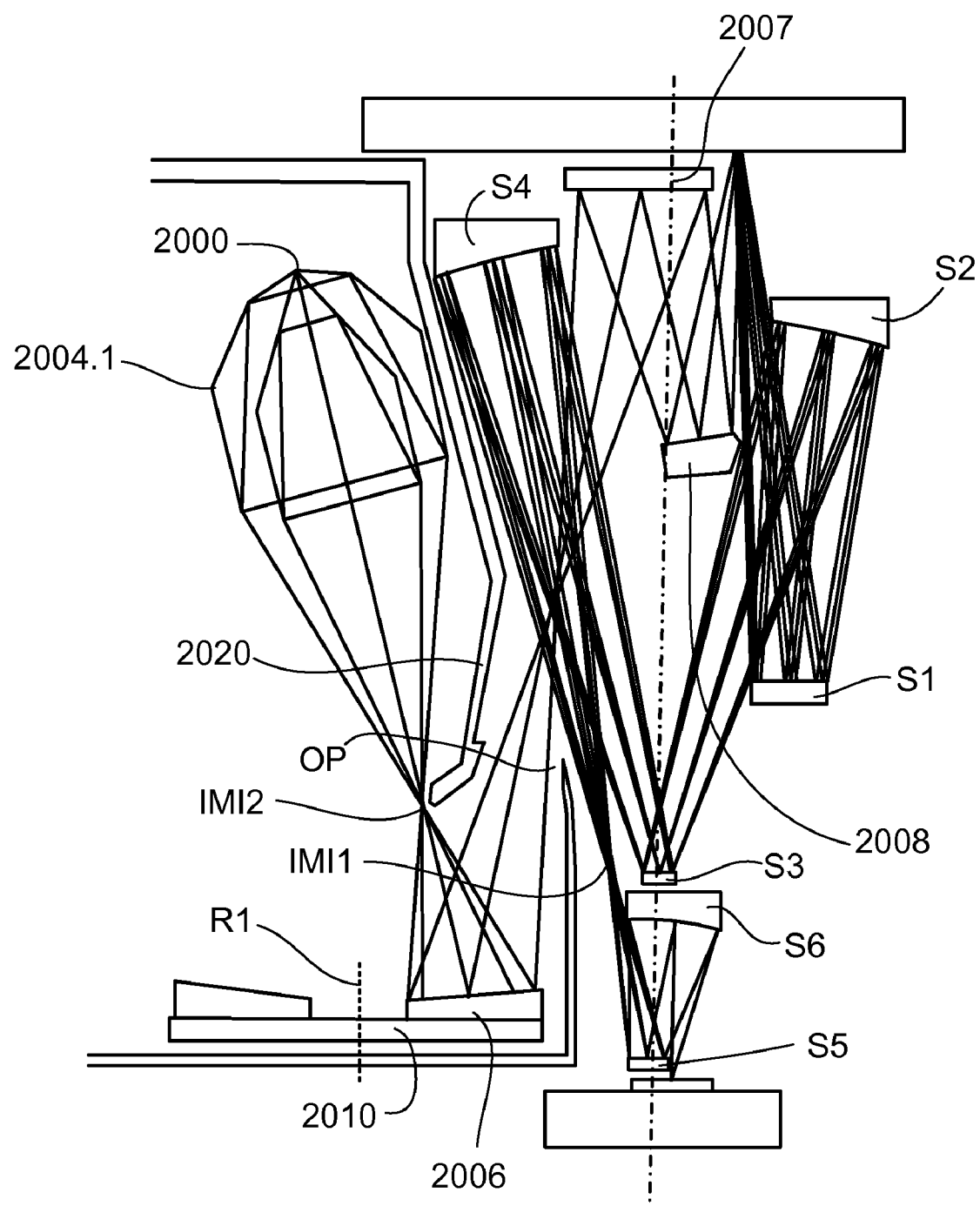
FIG. 9 shows a third embodiment of a microlithography projection exposure apparatus.

As an option, the folding mirror 2008 can be a mirror with refractive power. In the system shown in FIG. 9, the field facets are correlated crosswise with the respective pupil facets. This means that a field facet which in the meridional section shown in FIG. 9 is located in the right-hand part of the field facet mirror is correlated with a pupil facet in the left-hand part of the pupil facet mirror in the meridional section. As a consequence of this cross-over correlation, a constriction of the light ray pattern, i.e. an intermediate image IMI1 of the light source, is formed in the light path from the first facetted optical element to the second facetted optical element. The constriction or the intermediate image IMI1 makes it possible to arrange a limited passage opening OP in a protective wall 2020 that separates the unit comprising the light source 2000, the collector 2004.1 and the first facetted optical element 2006 from the unit that comprises the projection objective. Furthermore, an intermediate image IMI2 of the light source is also formed in the unit which comprises the light source 2000, the collector 2004.1 and the first facetted optical element 2006.

Figure 10:
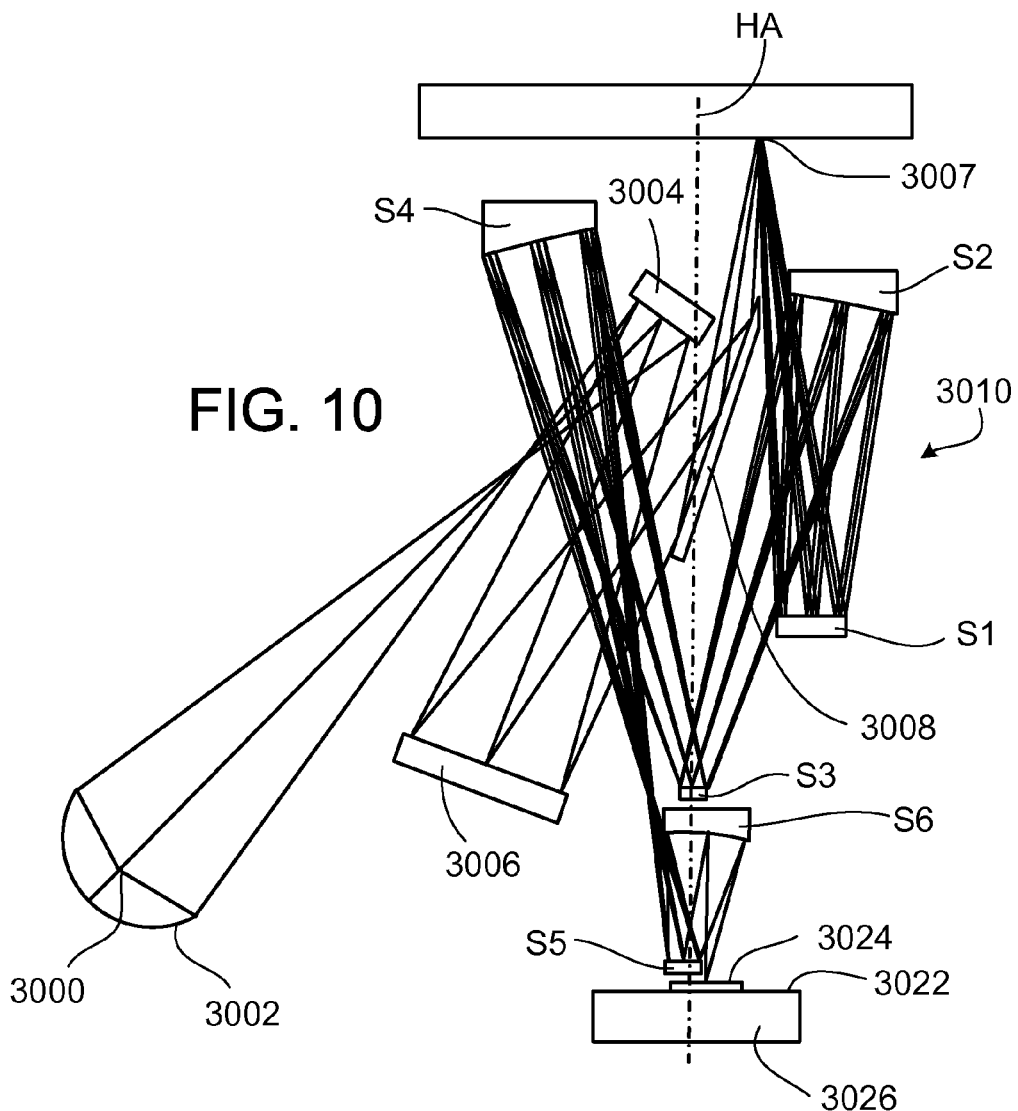
FIG. 10 shows a fourth embodiment of a microlithography projection exposure apparatus with a location-variant or field dependent diffuser.

FIG. 10 shows a further embodiment of a microlithography projection exposure apparatus, in particular for wavelengths in the EUV range, in which the optical integrator is not located in the mirrored entry pupil.

The illumination system of this microlithography projection exposure apparatus includes a location-variant or a field dependent diffuser 3006. This diffuser 3006 is designed in such a way that it does not need to be arranged in the plane of the mirrored entry pupil or in a plane that is conjugate to the latter, but that it can be arranged in almost any arbitrarily selected plane. The diffuser comprises a large number of individual mirror facets, optionally more than 1000, which have deflecting angles that depend on the location where the diffuser is arranged in the illumination system, so that each facet receives light from the light source and directs the light to an assigned discrete point of a field (not shown) that is formed in the object plane 3007 of the illumination system. The discrete points in the object plane 3007 are selected so that a field in the object plane 3007 is illuminated in a predetermined, for example arcuate, shape. The facet is furthermore arranged in such a way that, with the respectively assigned discrete point of the field in the object plane, the facet will illuminate a specific area in a pupil plane of the projection objective.

The diffuser 3006 is also referred to as a so-called specular reflector. It is distinguished in particular by the fact that the facets differ in their sizes and positions as well as in their angles of inclination, where the angles of inclination are defined by the respectively associated field points. The specular reflector optionally has a substantially similar shape as the field to be illuminated. If the field to be illuminated has an arcuate shape, the specular reflector is kidney-shaped.

Due to the fact that the place for the location-variant or field dependent diffuser 3006 can be arbitrarily chosen in the design of the illumination system, it is therefore possible to select an optimal location for the diffuser 3006 independent of the layout of the rest of the system. The diffuser is arranged optionally in such way that the layout of the system is optimized and the diffuser has an optimal size. A system with a location-variant or field dependent diffuser 3006 is illustrated in FIG. 10. The system of FIG. 10 includes a light source 3000. The light of the light source is collected by means of a collector mirror 3002 and directed to a folding mirror 3004. The folding mirror 3004 is necessary in order to separate the ray pattern of the illumination system from the ray pattern of the projection objective. The light falling on the mirror 3004 is reflected and sent to the location-variant or field dependent diffuser 3006. In contrast to the systems shown previously, the location-variant or field dependent diffuser 3006 is arranged in an arbitrarily selected plane, i.e. not in the mirrored entry pupil plane or a conjugate plane of the latter, nor in a field plane such as the object plane or a conjugate plane of the latter.

In the light path from the light source 3000 to the diffuser, the normal-incidence mirror 3004, which is placed before the diffuser 3006, has the task of acting as a filter for the light that falls on the location-variant or field dependent diffuser, as was described in the preceding examples. Based on this filtering effect, the location-variant or field dependent diffuser receives only usable radiation, specifically EUV light of a wavelength of 13.5 nm. This minimizes the radiation exposure load on the diffuser 3006, which has the result of a lower thermal stress load and a lower contamination.

The normal-incidence mirror 3004 can optionally be configured as a free-form surface with an extra-axial conical component. The function of a normal-incidence mirror of this kind is illustrated in FIG. 11 which shows how due to the design of the normal-incidence mirror as a free-form surface, for example with an extra-axial conical component, the location-variant or field dependent diffuser 3006 with the kidney-shaped layout receives a kidney-shaped and thus largely loss-free illumination.

Figure 11:
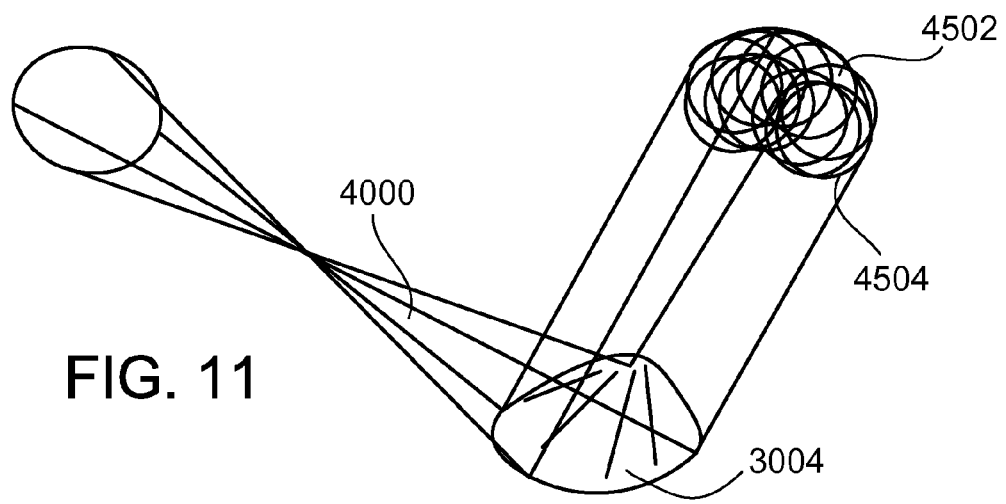
FIG. 11 shows the light-ray pattern from the light source to the diffuser, wherein the location-variant or field dependent diffuser is preceded in the light path by a normal-incidence mirror with a free-form surface and a conical component.

In FIG. 11, the incident light bundle arriving from the light source is labeled 4000. The light bundle 4000 falls on the normal-incidence mirror 3004 with a conical component as drawn in perspective in FIG. 11 and is reflected by the latter. The illumination pattern which this reflection produces in the plane where a location-variant or field dependent reflector or diffuser is arranged is labeled 4502. As can be clearly seen in FIG. 11, the illumination in the plane where the location-variant or field dependent diffuser is arranged is kidney-shaped and consists of sub-pupils 4504 that are offset from each other.

As an alternative to using a normal-incidence mirror, it is also possible to achieve a largely kidney-shaped illumination with a grazing-incidence mirror, for example with a shell of a grazing-incidence collector. Furthermore, the normal-incidence mirror can also have an optical function in addition to the illumination. The optical capability can be achieved by adding to the conical component a spherical, toroidal or generally aspherical component in order to give refractive power to the mirror.

In the system of FIG. 10, the light of the diffuser 3006 is directed into the object plane 3007 by means of a grazing-incidence mirror 3008. The object in the object plane is projected by means of the projection objective 3010 with six mirrors S1, S2, S3, S4, S5 and S6 into the image plane 3022 where the object to be exposed, for example the wafer 3024, is arranged on a carrier 3026. The projection objective with negative back focus has an optical axis HA.

With the system according to FIG. 10, a projection exposure apparatus is made available which illuminates a field of 26×2 mm$^2$ with an image-side numerical aperture NA≧0.25 (e.g., NA≧0.3). The projection exposure apparatus has a maximum of 10 or fewer components at which normal-incidence reflections occur.

Figure 12:
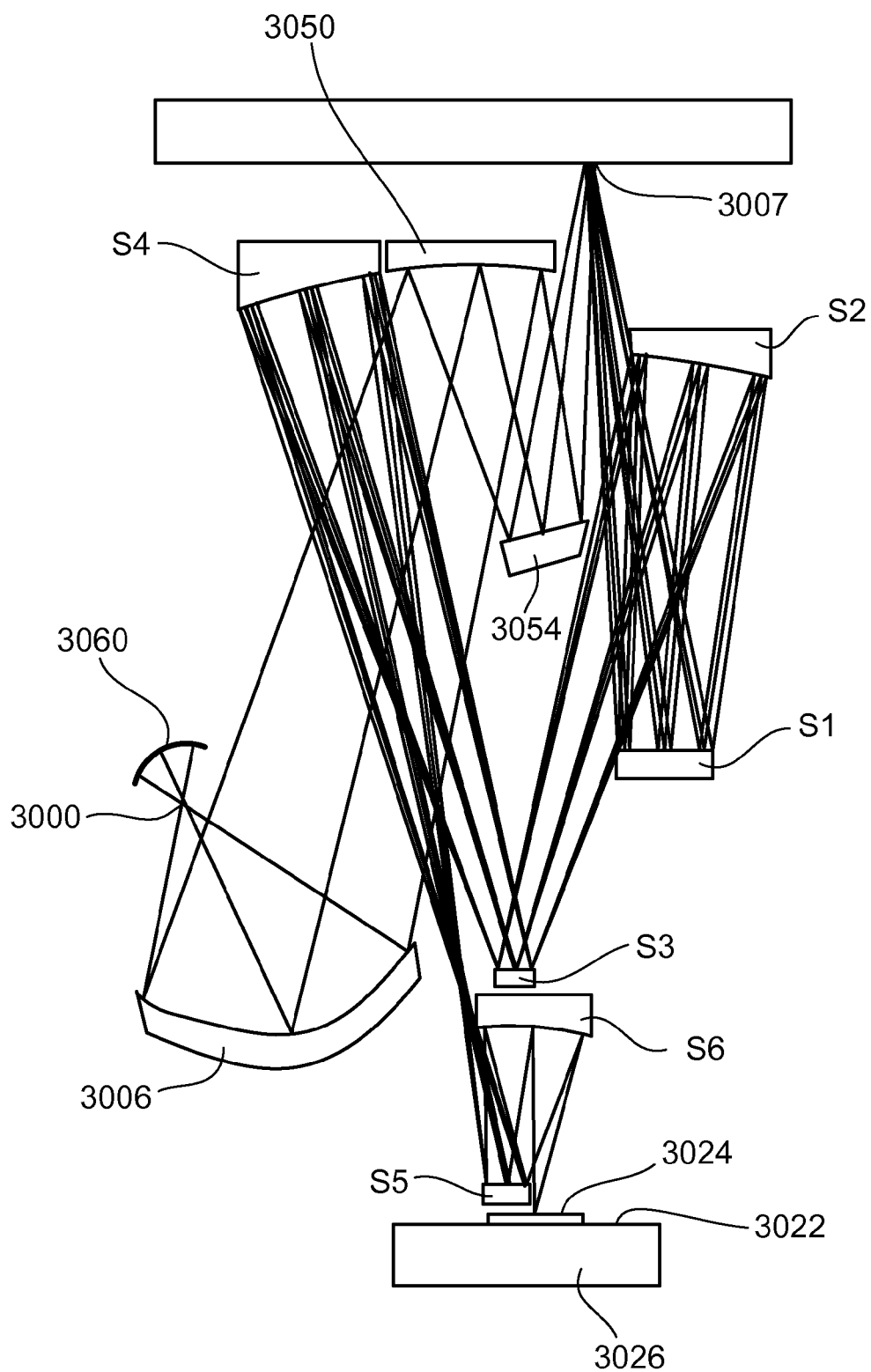
FIG. 12 represents a fifth embodiment of a microlithography projection exposure apparatus with a location-variant or field dependent diffuser and a collector mirror that is arranged in the light path before the diffuser for the kidney-shaped illumination of the diffuser.
Figure 13:
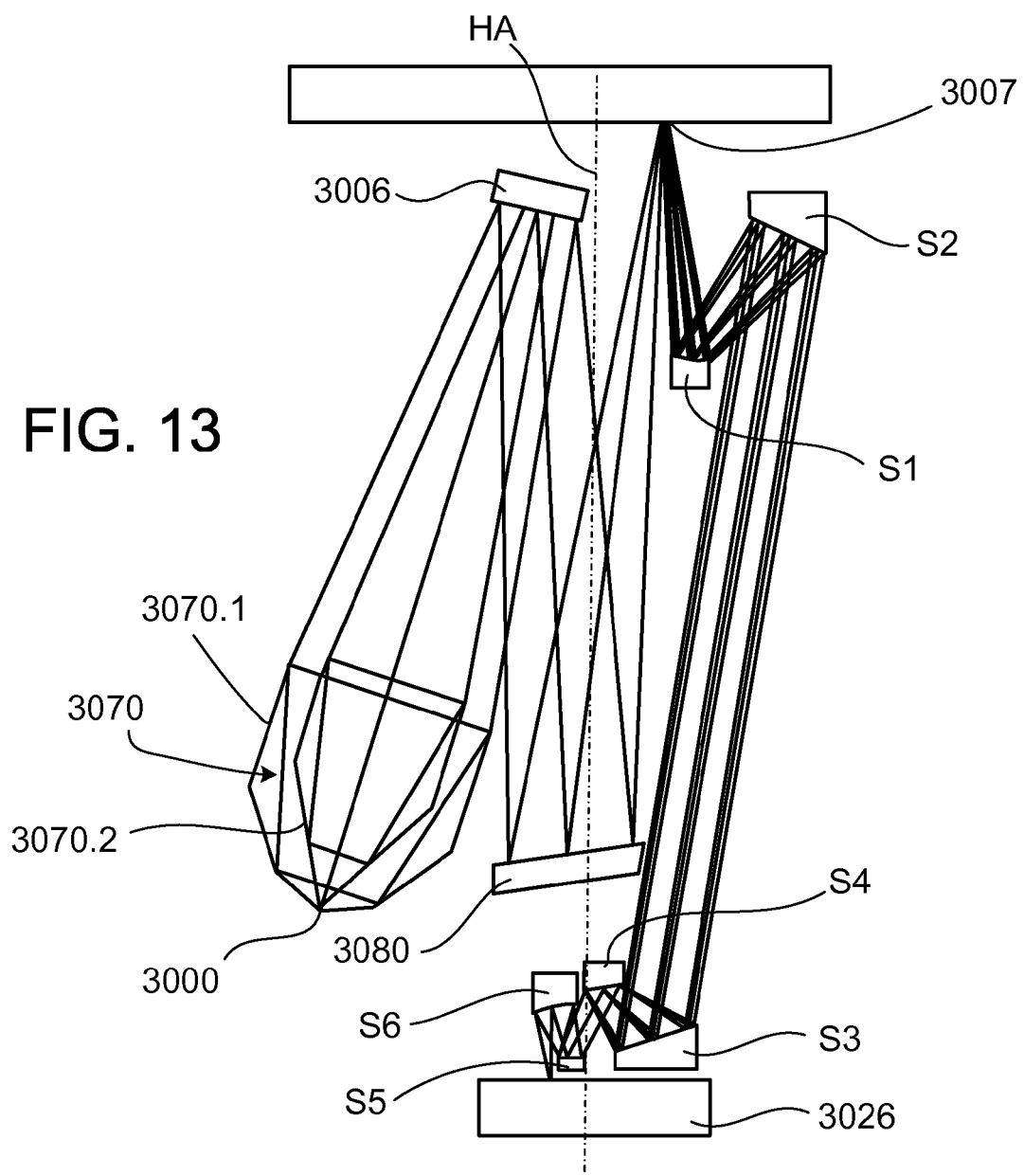
FIG. 13 represents a sixth embodiment of a microlithography projection exposure apparatus with an illumination system without an intermediate image and with a location—variant or field dependent diffuser.

FIGS. 12 and 13 show alternative configurations of a microlithography projection exposure apparatus with a location-variant or field dependent diffuser in the illumination system.

In the embodiment of FIG. 12, the location-variant or field dependent diffuser 3006 is followed in the ray path by a light-collecting normal-incidence mirror. Components that are analogous to those in FIG. 10 are labeled with the same reference numerals. Putting the normal-incidence mirror 3050 after the location-variant or field dependent diffuser in the light path from a light source to an image plane has in particular the advantage that the individual facets of the location-variant diffuser can be designed as planar mirrors. The light-collecting normal-incidence mirror 3050 produces a strongly magnified image of the light source 3000 in the object plane 3007 where the reticle is arranged, while the location-variant diffuser on the other hand provides a superposition of a multitude of images of the light source in the object plane 3007. The normal-incidence mirror 3050 with refractive power is followed in the light path in the illustrated example by a further mirror 3054, which is configured as a planar mirror. This mirror 3054 serves to fold the ray path. As a possible alternative, the second normal-incidence mirror 3054 could also be provided with refractive power, so that in combination with the first normal-incidence mirror 3050 the imaging scale ratio can be set to a specified target value and the size of the location-variant diffuser can thus be controlled. This allows the location-variant diffuser 3006 to be designed very large, so that the individual facet elements on the location-variant diffuser are likewise of an appreciable size. Due to the size of the location-variant diffuser 3006 and the individual facets arranged on it, the thermal stress load can be strongly reduced, as has been described above. The location-variant diffuser can also be formed on a curved carrier body.

In the embodiment of a system with a location-variant diffuser as shown in FIG. 12, the light of the light source 3000 is collected by a direction-reversing reflector 3060 which is configured in such a way that a kidney-shaped area is illuminated on the location-variant diffuser 3006. In this example, the direction-reversing reflector provides the largely arc-shaped illumination of the location-variant diffuser 3006, instead of the normal-incidence mirror of the embodiment of FIGS. 10 and 11 with a free-form surface with an extra-axial conical component.

A particularly simple illumination system with a location-variant or field dependent diffuser is shown in the example according to FIG. 13. Components that are analogous to whose in FIGS. 10 to 12 are labeled with the same reference numerals. In the embodiment of FIG. 13, the light of the light source is collected by a grazing-incidence collector 3070 with a large number of mirror shells 3070.1, 3070.2. The light received by the grazing-incidence collector is directed to a location-variant or field dependent diffuser 3006 which is arranged immediately before the object plane 3007. The light that is reflected by the location-variant or field dependent diffuser 3006 is directed to the object plane 3007. By adding a mirror 3080 by means of which the light reflected from the diffuser is folded back into the object plane 3007, the geometric efficiency of the system can be strongly enhanced. The embodiment illustrated in FIG. 13 is distinguished in particular by the fact that it has a very simple design structure and that there is no intermediate image in the illumination light path of the illumination system.

The projection objectives according to FIG. 12 as well as FIG. 13 are objectives with a negative back focus of the entry pupil and six mirrors S1, S2, S3, S4, S5 and S6.

The present disclosure provides for the first time a projection objective with negative back focus of the entry pupil which is designed in such a way that a cross-over between the illumination light path and the image-projecting light path in a microlithography projection exposure apparatus is largely avoided. This, in turn, makes it possible to realize a modular design of the projection exposure apparatus.

In addition to the microlithography projection systems with negative back focus of the entry pupil which allow a modular design of the foregoing description to be realized, the disclosure also provides microlithography projection systems with a small number of optical components and with an image-side numerical aperture NA≧0.25 (e.g., A≧0.3) with a maximum dimension ($D_x$, $D_y$) of a field on the image side of more than 1 mm (e.g., more than 3 mm, more than 4 mm, more than 5 mm, more than 6 mm, more than 8 mm, more than 10 mm, more than 12 mm, more than 15 mm, more than 20 mm, more than 25 mm). In a system of this type, there are optionally ten or fewer normal-incidence reflections on optical elements between the light source and the image plane, wherein the reflection on the reflective object that is arranged in the object plane, specifically the reflective reticle, is not counted. The size of the image field can be for example 2×26 $mm^2$. Particularly advantageous within this context are microlithography projection systems in which only one optical integrator is required. Among systems with only one optical integrator, a special advantage is held by those systems that are distinguished by the fact that the optical integrator can be placed at an arbitrarily chosen location in the microlithography projection exposure apparatus. Optical integrators which meet these requirements are in particular so-called location-variant or field dependent optical integrators or specular reflectors.

The invention claimed is:

1. A projection objective, comprising:
    an object plane in which an object field is formed,
    an entry pupil and an exit pupil,
    a mirrored entry pupil in a mirrored entry pupil plane obtained by mirroring the entry pupil at the object plane,
    an image plane,
    an optical axis,
    at least a first mirror and a second mirror,
    wherein the projection objective has a negative back focus of the entry pupil, and wherein a principal ray originating from a central point of the object field traverses the objective from the object plane to the image plane and intersects the optical axis in at least one point of intersection, wherein each individual point of intersection has along the optical axis a respective first distance A1 from the object plane and the mirrored entry pupil plane has a second distance A2 from the object plane, wherein A2 is less than A1, and wherein the exit pupil is a non-obscured exit pupil.

2. The projection objective according to claim 1, wherein the projection objective comprises at least four mirrors.

3. The projection objective according to claim 2, further comprising an aperture stop located in an aperture stop plane.

4. The projection objective according to claim 3, wherein: 1) a first number of mirrors, which in the light path from the object plane to the image plane lie before the aperture stop plane, form a first sub-objective; and 2) a second number of mirrors form a second sub-objective, wherein the second sub-objective includes the aperture stop plane.

5. The projection objective according to claim 4, wherein the second sub-objective has two mirrors.

6. The projection objective according to claim 4, wherein the projection objective comprises at a first mirror, a second mirror, a third mirror, a fourth mirror a fifth mirror and a sixth mirror, and wherein the first, second, third and fourth mirrors.

7. The projection objective according to claim 6, wherein the second sub-objective comprises the fifth mirror and the sixth mirror.

8. The projection objective according to claim 1, wherein the projection objective comprises at least six mirrors.

9. The projection objective according to claim 1, wherein the image-side numerical aperture is equal to or larger than 0.2.

10. The projection objective according to claim 1, wherein the projection objective comprises at a first mirror, a second mirror, a third mirror, a fourth mirror, a fifth mirror and a sixth mirror, and wherein the first mirror is convex-shaped, the second mirror is concave-shaped, the third mirror is concave-shaped, the fourth mirror is convex-shaped, the fifth mirror is convex-shaped, and the sixth mirror is concave-shaped.

11. The projection objective according to claim 1, wherein an intermediate image is formed in the light path from the object plane to the image plane.

12. The projection objective according to claim 11, wherein the projection objective comprises at least a first mirror, a second mirror, a third mirror, a fourth mirror, a fifth mirror and a sixth mirror, and wherein the intermediate image is formed between the fourth mirror and the fifth mirror.

13. The projection objective according to claim 12, wherein the first mirror is concave-shaped, the second mirror is concave-shaped, the third mirror is convex-shaped, the fourth mirror is concave-shaped, the fifth mirror is convex-shaped, and the sixth mirror is concave-shaped.

14. The projection objective according to claim 12, wherein an aperture stop is arranged a location selected from the group consisting of between the second mirror and the third mirror, and on the third mirror.

15. The projection objective according to claim 11, wherein the image-side numerical aperture NA is equal to or larger than 0.2.

16. The projection objective according to claim 1, wherein the projection objective is a catoptric projection objective.

17. The projection objective according to claim 1, wherein the projection objective is a catadioptric projection objective.

18. A microlithography projection exposure apparatus, comprising:
an illumination system,
a projection objective, wherein the projection objective has a negative back focus of the entry pupil and the microlithography projection exposure apparatus has a projection objective according to claim 1.

19. The microlithography projection exposure apparatus according to claim 18, wherein by mirroring of the entry pupil at the object plane a mirrored entry pupil of the projection objective is formed to the image side of the object plane, and wherein the illumination system includes an optical integrator that is formed in or near a plane in which the mirrored entry pupil is formed.

20. The microlithography projection exposure apparatus according to claim 19, wherein the optical integrator is a facetted mirror.

21. The microlithography projection exposure apparatus according to claim 19, wherein the optical integrator is a diffuser.

22. The microlithography projection exposure apparatus according to claim 21, wherein the diffuser comprises more than 500 mirror facets.

23. The microlithography projection exposure apparatus according to claim 21, wherein the diffuser is a holographic lattice grid.

24. The microlithography projection exposure apparatus according to claim 21, wherein an aperture stop is arranged in the light path before the diffuser.

25. The microlithography projection exposure apparatus according to claim 21, wherein at least one mirror is arranged in the light path after the optical integrator and before the object plane.

26. The microlithography projection exposure apparatus according to claim 21, wherein in the light path from the light source to the diffuser a grazing-incidence mirror is arranged before the diffuser.

27. The microlithography projection exposure apparatus according to claim 26, wherein the grazing-incidence mirror has a mirror surface that includes an extra-axial conical surface.

28. The microlithography projection exposure apparatus according to claim 26, wherein the grazing-incidence mirror or the normal-incidence mirror comprises a spherical, toroidal, or aspherical part.

29. The microlithography projection exposure apparatus according to claim 18, wherein the illumination system comprises a first facetted optical element with a plurality of first raster elements as well as a second facetted optical element with a plurality of second raster elements, wherein the second facetted optical element is arranged in or near the plane of the mirrored entry pupil.

30. The microlithography projection exposure apparatus according to claim 29, wherein a first raster element has substantially the shape of a field that is formed in the object plane.

31. The microlithography projection exposure apparatus according to claim 30, wherein a first raster element is configured with an arcuate shape.

32. The microlithography projection exposure apparatus according to claim 18, wherein by mirroring of the entry pupil at the object plane a mirrored entry pupil is formed in a mirrored entry pupil plane to the image side of the object plane, and wherein the illumination system includes an optical integrator, and wherein the optical integrator is not arranged in or near the mirrored entry pupil plane.

33. The microlithography projection exposure apparatus according to claim 32, wherein the optical integrator is not arranged in a plane that is conjugate to the object plane.

34. The microlithography projection exposure apparatus according to claim 32, wherein the optical integrator has more than 1000 individual facets.

35. The microlithography projection exposure apparatus according to claim 32, wherein the optical integrator illuminates a field in the object plane, wherein the field has a field shape.

36. The microlithography projection exposure apparatus according to claim 35, wherein the optical integrator has a shape, and wherein said shape is substantially the same as the field shape.

37. The microlithography projection exposure apparatus according to claim 32, wherein the optical integrator is kidney-shaped.

38. The microlithography projection exposure apparatus according to claim 32, wherein the optical integrator has a plurality of facets, and wherein each facet illuminates a plurality of discrete field points in the object plane and of pupil locations in a pupil plane.

39. The microlithography projection exposure apparatus according to claim 32, wherein a normal-incidence mirror is arranged in the light path from the light source to the optical integrator.

40. The microlithography projection exposure apparatus according to claim 39, wherein the normal-incidence mirror has a mirror surface which includes an extra-axial conical surface.

41. The microlithography projection exposure apparatus according to claim 39, wherein the normal-incidence mirror has a mirror surface that is configured as a free-form surface.

42. The microlithography projection exposure apparatus according to claim 41, wherein the free-form surface is of a kind that has an extra-axial conical component.

43. The microlithography projection exposure apparatus according to claim 32, wherein in the light path from the light source to the object plane a normal-incidence mirror is arranged after the optical integrator.

44. A microlithography projection exposure apparatus, comprising:

an illumination system that is traversed by an illumination ray bundle:

an object plane in which an object field is being illuminated;

a projection objective having a non-obscured exit pupil, wherein the projection objective is traversed by an image-projecting light path from the object plane to an image plane, and the projection objective has a negative back focus of an entry pupil, and the microlithography projection exposure apparatus is configured in such a way that the illumination ray bundle which travels from a next-to-last optical component in the light path of the illumination system to the object plane does not cross over the image-projecting light path except for the area where a reflection on the object plane takes place.

45. The microlithography projection exposure apparatus according to claim 44, wherein the illumination ray bundle of the illumination system and the image-projecting ray path of the projection objective do not crossing over each other in the meridional plane in a light path from the object plane to the image plane.

* * * * *

UNITED STATES PATENT AND TRADEMARK OFFICE
CERTIFICATE OF CORRECTION

| | |
|---|---|
| PATENT NO. | : 7,869,138 B2 |
| APPLICATION NO. | : 11/689672 |
| DATED | : January 11, 2011 |
| INVENTOR(S) | : Hans-Juergen Mann |

It is certified that error appears in the above-identified patent and that said Letters Patent is hereby corrected as shown below:

Column 9,
Line 3, Delete "FIG." and insert --FIGS.--

Column 11,
Line 27, After "11" delete "n".
Line 39, Delete "W s-" and insert --$W_{rms}$--

Column 14,
Line 35, Delete "$M_x$)" and insert --$M_x$).--

Column 16,
Line 1, Delete "mans" and insert --means--

Column 17,
Line 17, Delete "figuration" and insert --configuration--
Line 23, Delete "1043" and insert --104--

Column 18,
Line 6, After "path" insert --.--

Column 21,
Line 63, Delete "6a" and insert --6c--

Column 22,
Line 5, Delete "PPNPNP" and insert --P-P-N-P-N-P--

Column 27,
Line 33, Delete "whose" and insert --those--

Signed and Sealed this
Twenty-second Day of March, 2011

David J. Kappos
*Director of the United States Patent and Trademark Office*

Column 28,
Line 51, Delete "fourth mirror" and insert --fourth mirror,--

Column 29,
Line 44, Delete "19" and insert --20--